United States Patent [19]

Igarashi et al.

[11] Patent Number: 5,355,085
[45] Date of Patent: Oct. 11, 1994

[54] MULTICHANNEL SQUID FLUX METER HAVING MULTIPLEXED SQUID FLUX SENSORS

[75] Inventors: Yutaka Igarashi, Gotenba; Takao Goto, Kawasaki; Takehiko Hayashi, Kawasaki; Yoshiyasu Nakashima, Kawasaki; Norio Fujimaki, Atsugi; Hajime Hayashi, Yamato; Kohtaro Gotoh, Tokyo, all of Japan

[73] Assignee: Fujitsu, Ltd., Kanagawa, Japan

[21] Appl. No.: 672,866

[22] Filed: Mar. 20, 1991

[30] Foreign Application Priority Data

Mar. 20, 1990 [JP] Japan ................ 2-70380
Nov. 30, 1990 [JP] Japan ................ 2-336401

[51] Int. Cl.$^5$ ........................... G01R 33/035
[52] U.S. Cl. ........................ 324/248; 307/306; 340/870.13; 505/846; 324/260
[58] Field of Search ............ 324/247, 248, 260, 326; 307/306; 340/870.13; 505/846; 370/77; 128/653.1

[56] References Cited

U.S. PATENT DOCUMENTS

| | | | |
|---|---|---|---|
| 4,489,274 | 12/1984 | Berlincourt | 324/248 |
| 4,591,787 | 5/1986 | Hoenig | 324/248 |
| 4,646,025 | 2/1987 | Martin et al. | 324/248 X |
| 4,680,585 | 7/1987 | Fasching | 340/870.13 |
| 4,761,611 | 8/1988 | Hoenig | 324/248 |
| 4,771,239 | 9/1988 | Hoenig | 324/248 |
| 4,947,118 | 8/1990 | Fujimaki | 324/248 |
| 5,030,614 | 7/1991 | Hollander et al. | 324/248 X |
| 5,045,788 | 9/1991 | Hayashi et al. | 324/248 |
| 5,093,618 | 3/1992 | Goto et al. | 324/248 |

FOREIGN PATENT DOCUMENTS

| | | |
|---|---|---|
| 0111826A3 | 6/1984 | European Pat. Off. . |
| 0210489A1 | 2/1987 | European Pat. Off. . |
| 0408302A2 | 1/1991 | European Pat. Off. . |
| 63-290979 | 11/1988 | Japan . |

OTHER PUBLICATIONS

*Journal of Physics E. Scientific Instruments*, vol. 17, No. 6, Jun. 1984, Bristol, GB, pp. 504–512, J. O. Lekkala et al., "Multiplexed SQUID Vectormagetmeter for Biomagnetic Research".

*IEEE Transactions on Geoscience and Remote Sensing*, vol. GE-23, No. 4, Jul. 1985, New York, U.S., pp. 552–561, R. Hastings et al., "Cryogenic Magnetic Gradiometers for Space Applications".

D. Drung, *Digital Feedback Loops for D.C. SQUIDs*, Cryogenics, 1986, vol. 26, Nov., pp. 623–627.

Hisao Furukawa and Kimisuke Shirae, *Multichannel DC SQUID System*, Japanese Journal of Applied Physics, vol. 28, No. 3, Mar. 1989.

H. E. Hoenig, G. Daalmans, W. Folberth, H. Reichenberger, S. Schneider and H. Seifert; *Biomagnetic Multichannel System with Integrated SQUIDs and First Order Gradiometers Operating in a Shielded Room;* Cyrogenics, 1989, vol. 29, Aug., pp. 809–813.

Primary Examiner—Gerard R. Strecker
Attorney, Agent, or Firm—Staas & Halsey

[57] ABSTRACT

A plurality of SQUID flux sensors are supplied with their respective bias currents at the same time from a bias source. A superconducting multiplexer multiplexes output signals of the SQUID flux sensors during an interval of time when the bias currents are supplied to the SQUID flux sensors. A multiplexer, placed in a room-temperature environment, distributes each of the multiplexed output signals of the SQUID flux sensors to a respective one of the output terminals which correspond to the SQUID flux sensors. Each signal which has been output to an individual output terminal is counted by a counter, so that an external magnetic flux to a corresponding SQUID flux sensor is measured.

15 Claims, 26 Drawing Sheets

MULTICHANNEL SQUID FLUX METER HAVING MULTIPLEXED SQUID FLUX SENSORS

BACKGROUND OF THE INVENTION

1. Field of the Invention

The present invention relates to a multichannel SQUID flux meter adapted to detect magnetic fields from a number of regions at a time by the use of a plurality of SQUID flux sensors.

2. Description of the Background Art

High-sensitivity flux meters or magnetometers using superconducting quantum interference devices (SQUIDs) have been employed recently to measure small magnetic fields generated from a living body. By measuring the distribution of magnetic fields in the brain and heart, in particular, it becomes possible to presume current sources generating the magnetic fields. It is pointed out that this provides very significant information for diagnosis and is useful for identifying neural activity within a living organism. To measure the distribution of magnetic fields, a one-channel SQUID flux meter may be used to measure data from each region. With this method, however, it takes a long time to measure magnetic fields and thus a subject under examination will get tired. Moreover, current sources cannot be presumed with accuracy because magnetic fields in different locations cannot be measured simultaneously. For this reason there is a requirement for a multichannel SQUID flux meter which has an array of flux sensors and is adapted to measure magnetic fields from different regions simultaneously.

To meet this requirement, a multichannel SQUID flux meter system has been proposed in which there are provided processing circuits corresponding in number to the SQUID flux sensors, each of the processing circuits converting an output signal of a corresponding flux sensor to a magnetic-field signal (H. E. Hoenig et al., Biomagnetic multichannel system with integrated SQUIDs and first order gradiometers operating in a shielded room, Cryogenics, vol. 29, August, pp 809–813, 1989). In addition, a simplified system has been proposed in which each SQUID is driven by a different frequency and the outputs of the SQUIDs are multiplexed for transmission over a single line (Furukawa et al., Japanese Journal of Apply Physics, vol. 28, No. 3, March, 1989, pp L456–L458). Both of these systems use analog SQUIDs which provide a small analog signal.

As a digital SQUID, on the other hand, there is known a pulse-output-type SQUID in which a SQUID, consisting of a two-junction quantum interference device, is operated with an ac bias (Japanese Unexamined Patent Publication No. 63-290979). Also, there is known a system in which a voltage output of an analog SQUID, which operates with a dc bias, is applied to a superconducting comparator or 1-bit A/D converter to produce a pulse output (D. Drug, Cryogenics, vol. 26, pp 623–627, 1986). The digital SQUID has a feature that its output S/N ratio can be increased.

FIG. 1 illustrates a prior art multichannel SQUID magnetometer. In the figure, 1 and 2 denote room-temperature sections placed in a room-temperature environment, while 3 denotes a low-temperature section which is maintained at an extremely low temperature. The low-temperature section 3 has SQUIDs 4, 5, and 6 for measuring magnetic flux density; AND gates 7, 8, and 9 adapted to select a measurement channel; feedback circuits 10, 11, and 12 for applying feedback fields to the SQUIDs 4, 5, and 6; a superconducting decoder 13 for enabling the AND gates 7, 8 and 9 selectively; and a control cable 14 for supplying parallel channel select signals to the decoder from outside. The room-temperature section 1 has amplitude regulators 15, 16, and 17 for regulating the magnitude of high-frequency bias currents flowing through the SQUIDs (each including a coil which couples with a magnetic sensor and a magnetic feedback coil) and current sources 18, 19, and 20 for supplying high-frequency bias currents to the respective individual SQUIDs.

The operation of the prior art SQUID magnetometer is as follows.

In a channel selected by an enabled one of the AND gates 7, 8, and 9, an output current corresponding to the number of output pulses of the corresponding SQUID flows through the feedback coil placed in the neighborhood of the SQUID, so that a feedback magnetic field is generated in the direction to cancel out an external magnetic field applied to the SQUID.

Radio-frequency pulses are output according to variations of the external field until the external field has been canceled out by the feedback field. By counting the number of high-frequency pulses by means of a processor 21, it becomes possible to measure the density of magnetic flux externally applied to each of the SQUIDs 4, 5, and 6.

FIG. 2 illustrates a relationship between gate select pulses and SQUID output pulses.

In FIG. 2, (a), (c), and (e) indicate SQUID output pulses when channels CH1, CH2, and CHn are selected, while (b), (d), and (f) indicate AND-gate enabling pulses for selecting channels CH1, CH2, and CHn, respectively.

As can be seen, in the prior art, the output pulses of the SQUID in each channel correspond in number to the magnetic flux density applied thereto.

The output pulses of the channels selected on a time-division basis are fed into the processing unit 21 in the room temperature section 2, so that they are counted by its counter to compute magnetic flux density.

With the conventional SQUID magnetometer described above, there is a limit to speeding up of measurement of magnetic flux density because high-speed pulses output from each SQUID are fed into a counter maintained at room temperature. Moreover, the conventional SQUID magnetometer is not sufficient to accommodate an increased number of channels.

Furthermore, with the conventional multichannel SQUID magnetometer, since each SQUID is adapted to operate only when its associated channel is selected by the decoder, measurement has to be initiated from a start level each time a channel is selected, requiring a certain period of time until the measured value has been settled. Therefore, simultaneous measurement of a large number of channels is difficult.

This will be explained more specifically. From a consideration of conventional examples , the frequency bandwidth required for biomagnetism measurement is several hundreds of hertz . Assuming the frequency bandwidth to be 300 Hz , all the channels will have to be scanned every 1/600 Hz, i.e. , 1.7 ms as can be seen from the sampling theorem . Assuming now that the number of channels is 100, then a time interval allotted to each channel will be 1.7 ms/100=17 $\mu$s. When a digital SQUID is operated in a feedback mode so as to obtain a magnetic flux signal, on the other hand, the magnetometer has the same type of transfer function as a first-order lowpass filter for a small signal such as biomagnetism (see Fujimaki et al., J. Apply. Phys., 65(4), pp 1626–1630, 1989) and its cutoff frequency is given by $$\omega o = 2 f_B \cdot \Delta\Phi \cdot dP/d\Phi$$

where fB is a bias frequency applied to the SQUID, $\Delta\Phi$ is a quantity of feedback per pulse, P is the switching probability and $\Phi$ is the signal magnetic flux.

Assuming that the bias frequency=1 MHz, $\Delta\Phi = 1 \times 10^{-5}\Phi o$, $dp/d\Phi = 100/\Phi o$, fo would be about 320 Hz. However, in order to catch up with input magnetic flux during the time interval allotted to each channel, i.e., 17 $\mu$s, the frequency bandwidth is required to be more than 20 KHz (the bandwidth required to catch up with more than 90% of the input flux). Thus, the bias frequency must be further increased by at least two orders of magnitude. To increase the sensitivity of the magnetometer, $\Delta\Phi$ must be decreased. If $\Delta\Phi$ were decreased, the bias frequency would have to be further increased to compensate for a decrease in $\Delta\Phi$.

By the way, a matter of importance in the multichannel version of the SQUID magnetometer is how to decrease the number of signal lines to the SQUIDs. The reason is that SQUID sensors are usually placed in a low-temperature environment cooled by a coolant such as liquid helium. Also, if the number of channels were increased, the signal lines connecting the SQUID sensors to circuitry kept at superconducting or low temperature would be increased and hence the consumption of the expensive coolant would also be increased. With the conventional analog SQUID system, a processing circuit (maintained at room temperature) is provided for each of the SQUID sensors. Thus, output lines and feedback lines corresponding in number to channels are required. In the frequency multiplexing, although only one output line suffices, as many feedback lines as there are channels are required.

As described above, in order to realize a multichannel SQUID magnetometer with more than 100 channels, a bias frequency as high as several hundreds of MHz is required. In the case of multichannel, a problem which arises with the operation in such a high frequency range is that crosstalk is liable to occur between channels. Moreover, the conventional multichannel SQUID magnetometer suffers from a problem that an increase in the number of channels results in an increase in the consumption of a coolant such as liquid helium.

SUMMARY OF THE INVENTION

It is an object of the present invention to realize a multichannel SQUID magnetometer by speeding up a counter for counting output pulses of each of SQUID flux sensor.

It is another object of the present invention to speed up the response of each SQUID flux sensor by the use of a low bias frequency and reduce the consumption of a coolant such as liquid helium even if the number of channels is increased.

According to a preferred embodiment of the present invention, a bias means supplies bias currents to a plurality of SQUID flux sensors. The bias means comprises, for example, an oscillator, and supplies an equal bias current to each of the SQUID flux sensors.

First conversion means comprises a superconducting circuit and multiplexes output signals of the SQUID flux sensors during a time interval when the bias currents are supplied. The first conversion means comprises, for example, a superconducting multiplexer.

A second conversion means distributes signals multiplexed by the first conversion means to output terminals. The second conversion means comprises, for example, a demultiplexer which distributes each of the multiplexed signals from the superconducting multiplexer to a respective one of the output terminals.

In the preferred embodiment, the SQUID flux sensors are supplied with their respective bias currents at the same time. The output signals of the SQUID flux sensors are multiplexed by the first conversion means comprising a superconducting multiplexer and then transmitted down an output line.

Each of the multiplexed signals is distributed to a respective one of the output terminals corresponding to the channels. Pulses are counted for each of the channels, thereby measuring an external magnetic field to each of the SQUID flux sensors.

As described above, the output signals of the SQUID flux sensors are multiplexed by the first conversion means comprising a superconducting circuit and hence a single output line is sufficient to connect the first conversion means on the low-temperature side to the second conversion means on the room-temperature side, so that the consumption of a coolant for cooling the low-temperature side can be reduced.

Furthermore, since the flux SQUID sensors are supplied with bias currents at the same time and output signals of the SQUID flux sensors are multiplexed within a period of time when the bias currents are supplied, the response of the SQUID flux sensors can be made fast without increasing the bias frequency.

DETAILED DESCRIPTION OF THE PREFERRED EMBODIMENT

First, a first basic arrangement of the present invention will be described with reference to FIG. 3 in which a two-channel SQUID magnetometer is illustrated as an example.

Figure 1:
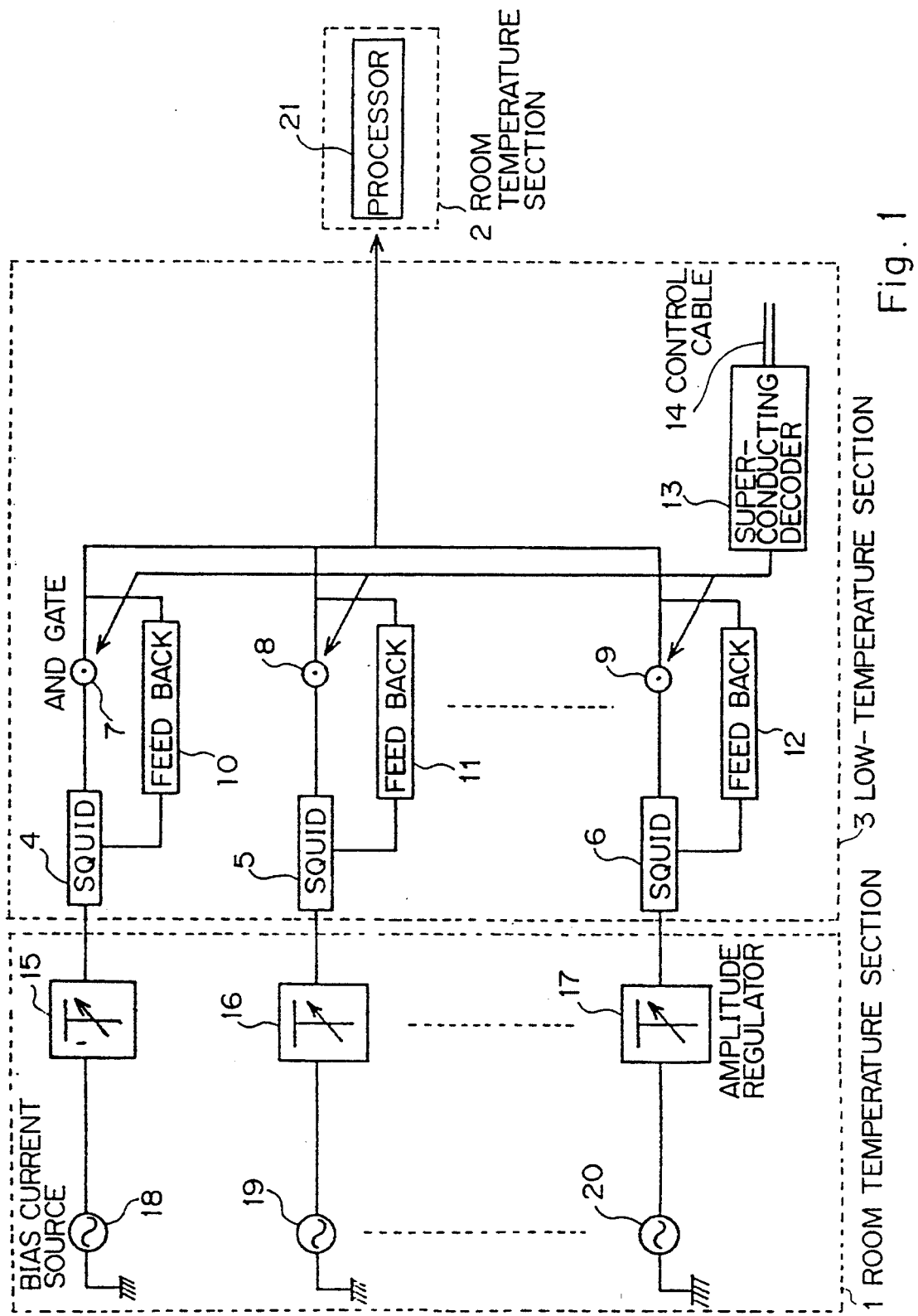
FIG. 1 is a schematic diagram of a conventional multichannel SQUID magnetometer.
Figure 2:
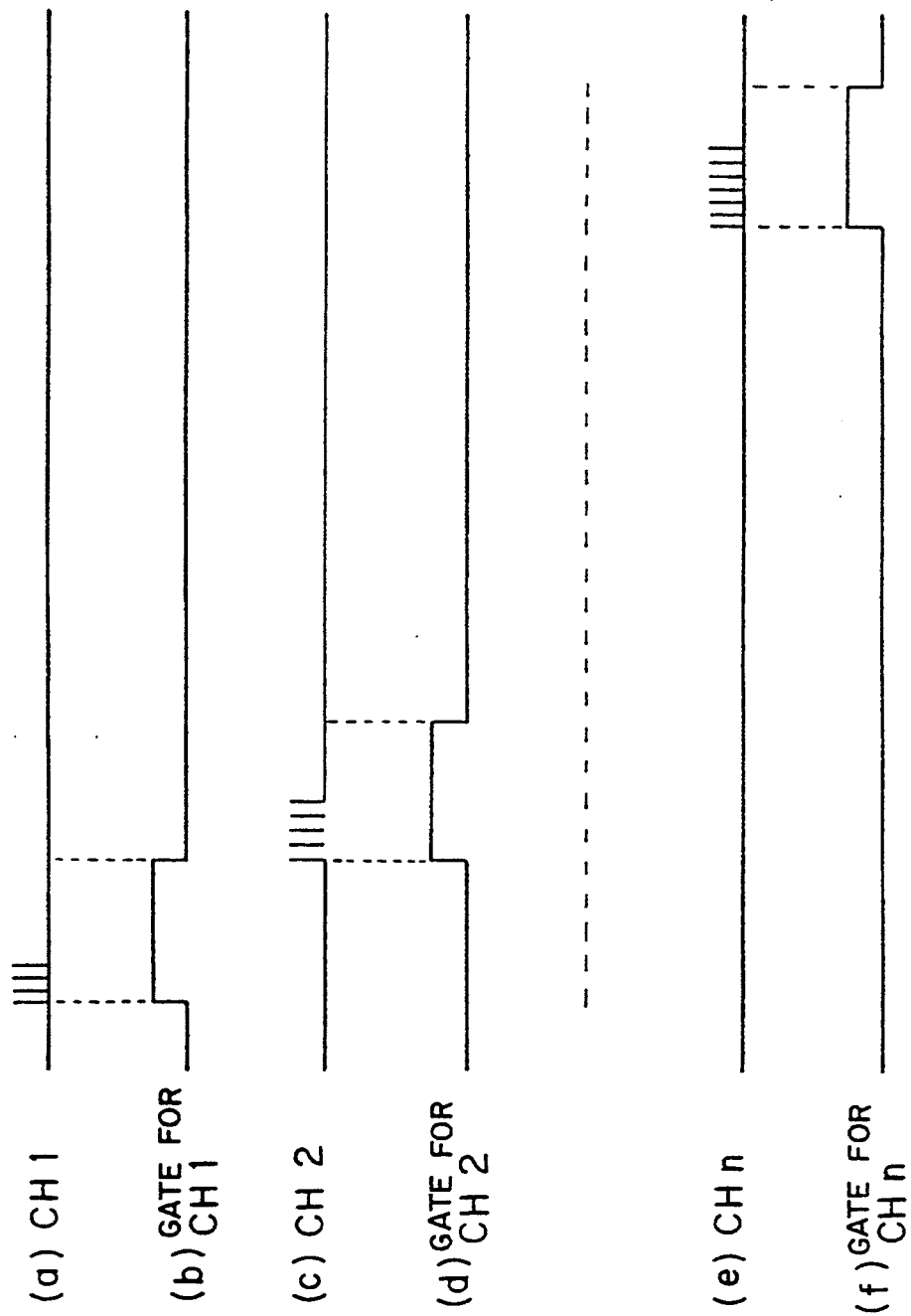
FIG. 2 is a timing diagram of the conventional multichannel SQUID magnetometer of FIG. 1.
Figure 3:
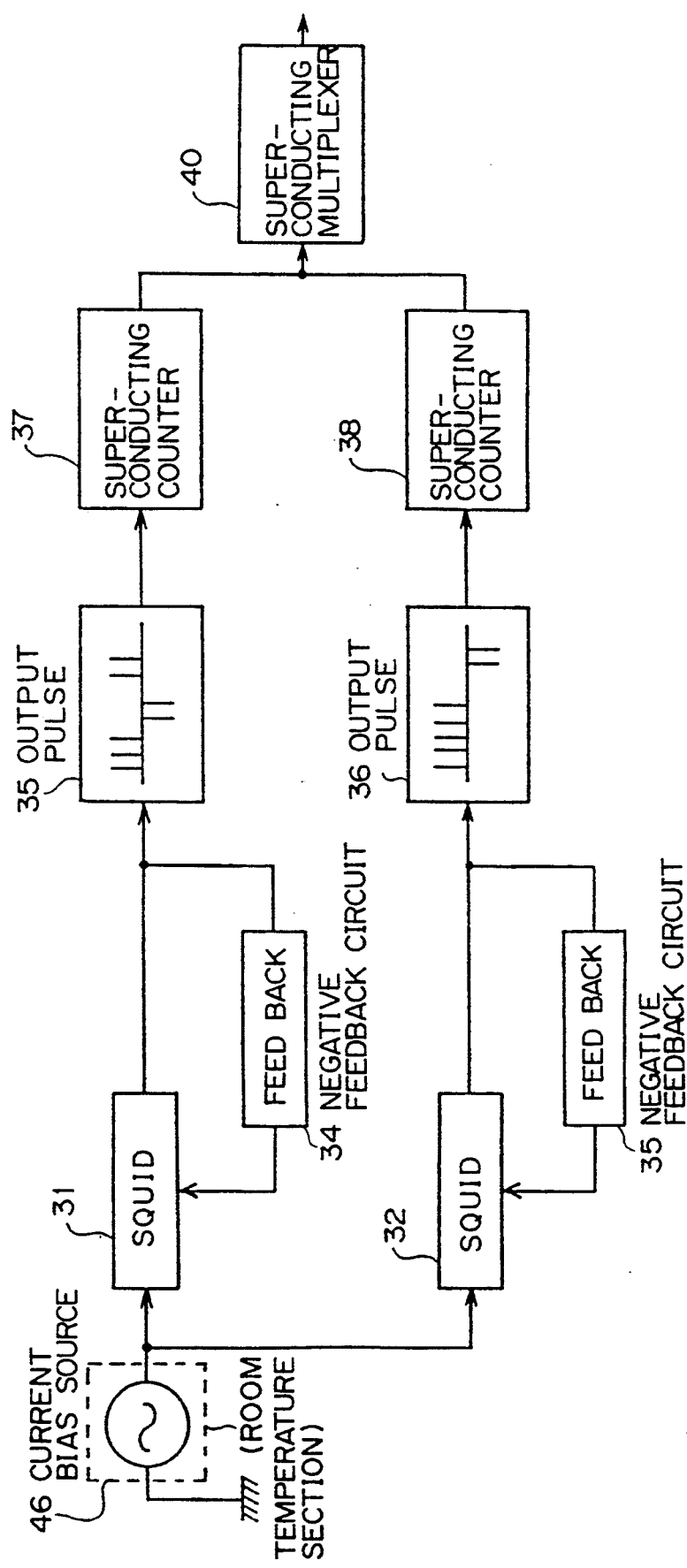
FIG. 3 illustrates a first basic arrangement of the present invention.

In FIG. 3, 31 and 32 denote SQUIDs, 34 and 35 denote negative feedback circuits for applying feedback magnetic fields to the SQUIDs 31 and 32 in the direction to cancel out input magnetic fields thereto, 35 and 36 denote output pulses of the SQUIDs 31 and 32 which are of positive polarity when the magnetic field increases or is of negative polarity when the magnetic field decreases, the number of the output pulses corresponding to a variation of the magnetic field, 37 and 38 denote up/down counters which are each constructed from a superconducting circuit and incremented when a positive pulse is applied thereto or decremented when a negative pulse is applied thereto, 40 denotes a superconducting multiplexer for selecting channels on a time-division basis, and 46 denotes a current bias source for providing a radio-frequency bias current to the SQUIDs 31 and 32.

In the above arrangement, all the constituent elements are placed in a low-temperature environment except the current bias source.

Next, the operation of the circuit will be described with reference to a timing diagram of FIG. 4.

Figure 4:
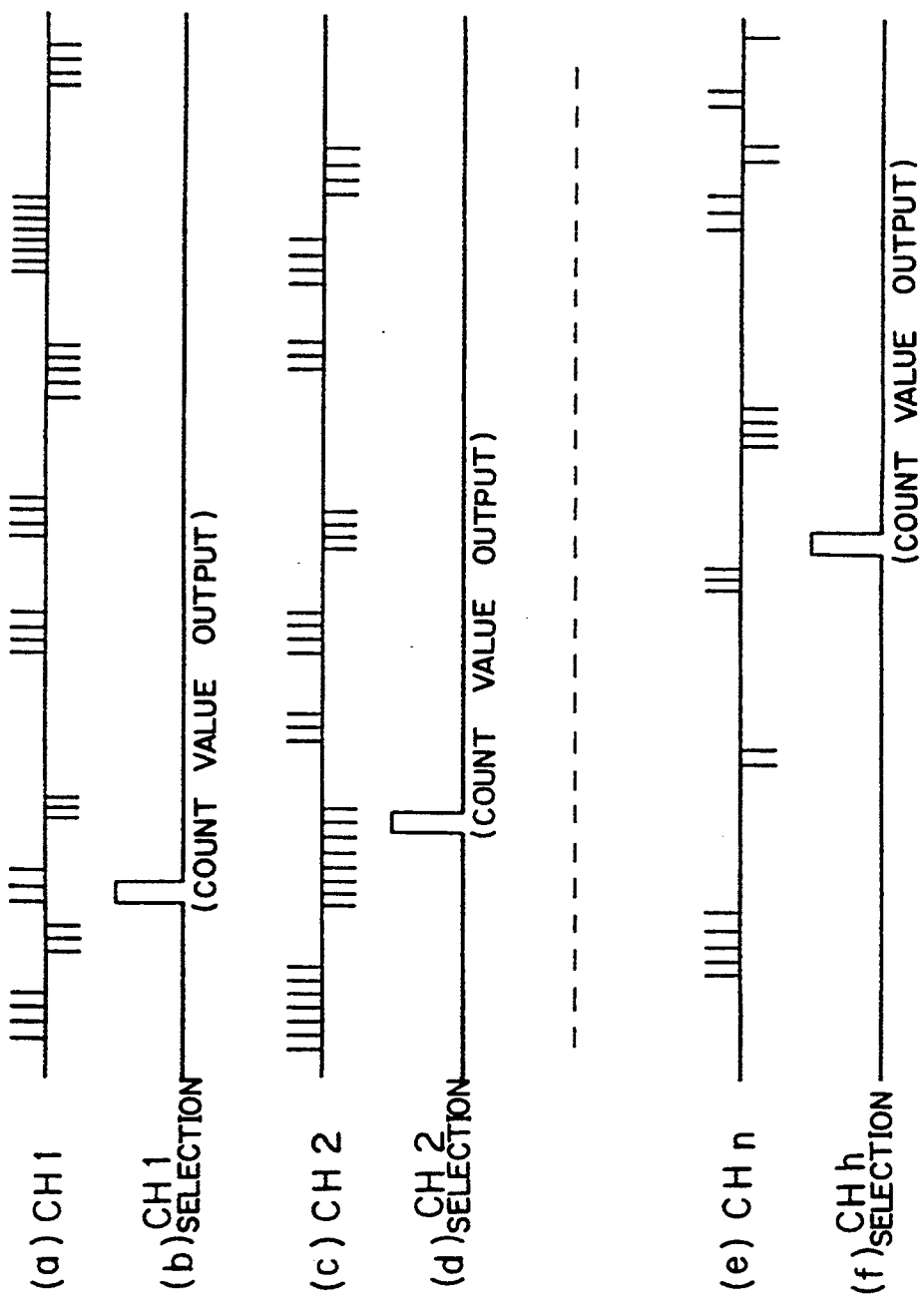
FIG. 4 is a timing diagram which is useful in understanding the operation of the SQUID magnetometer of FIG. 3.

FIG. 4 is a timing diagram, in n channels, of SQUID outputs in the channels and channel select pulses used by the superconducting multiplexer 40 to select the channels.

In FIG. 4, (a), (c) and (e) illustrate pulses output from the SQUIDs in the channels CH1, CH2 and CHn, respectively, and (b), (d) and (f) illustrate pulses for selecting the channels CH1, CH2 and CHn, respectively. When selected, each channel outputs a count of the SQUID output pulses obtained so far.

Suppose now that the channel 1 and the channel 2 in the basic arrangement of FIG. 3 correspond to the channel CH1 and the channel CH2, respectively, of FIG. 4.

Whenever the input magnetic field to each of the SQUIDs 31 and 32 varies, pulses are output therefrom, the number of which corresponds to a variation in the input magnetic field. That is, when the input magnetic field varies in the positive direction, positive pulses are output at the frequency of the radio-frequency bias current from the current bias source 46 until a feedback magnetic field is applied to cancel out the varying input magnetic field. However, when the input magnetic field varies in the negative direction, negative radio-frequency pulses are output until the varying input magnetic field is canceled out by a feedback magnetic field. In FIG. 4, (a) and (c) illustrate such output pulses from the SQUIDs 31 and 32.

The superconducting counters 37 and 38, which are up/down counters, are incremented when positive pulses are generated and decremented when negative pulses are generated, so that counter values indicate magnetic flux density present at an arbitrary point of time.

The superconducting multiplexer 40 selects the channels 1 and 2 in sequence on a time-division basis, so that a counter value in the selected channel is output to outside (FIG. 4 (b), (d)). The magnetic flux density can be measured accurately because the input magnetic field varies slowly in comparison with the frequency of the output pulses from the SQUID.

Figure 5:
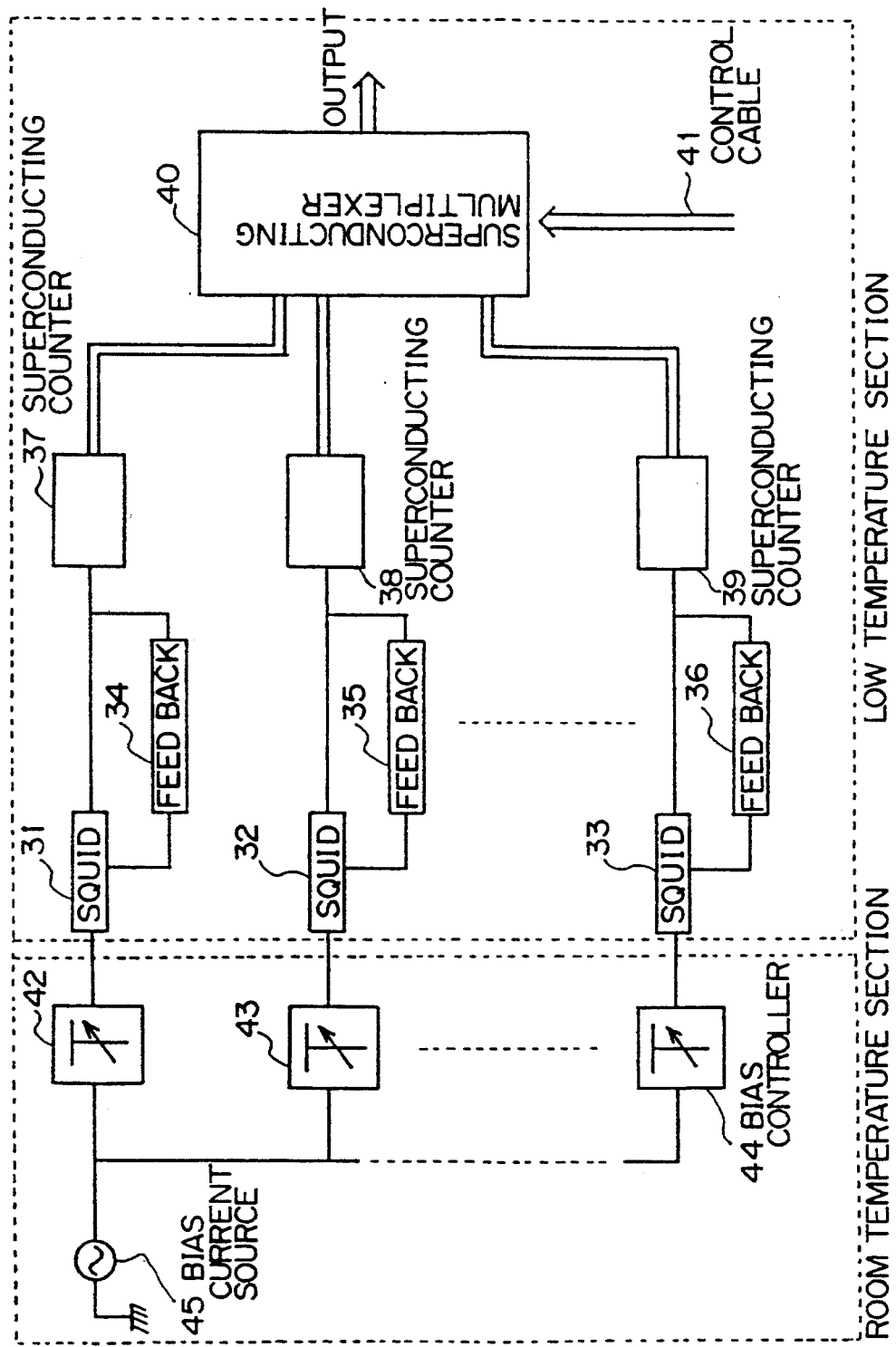
FIG. 5 illustrates an arrangement of a multichannel SQUID magnetometer according to a first embodiment of the present invention.
Figure 6:
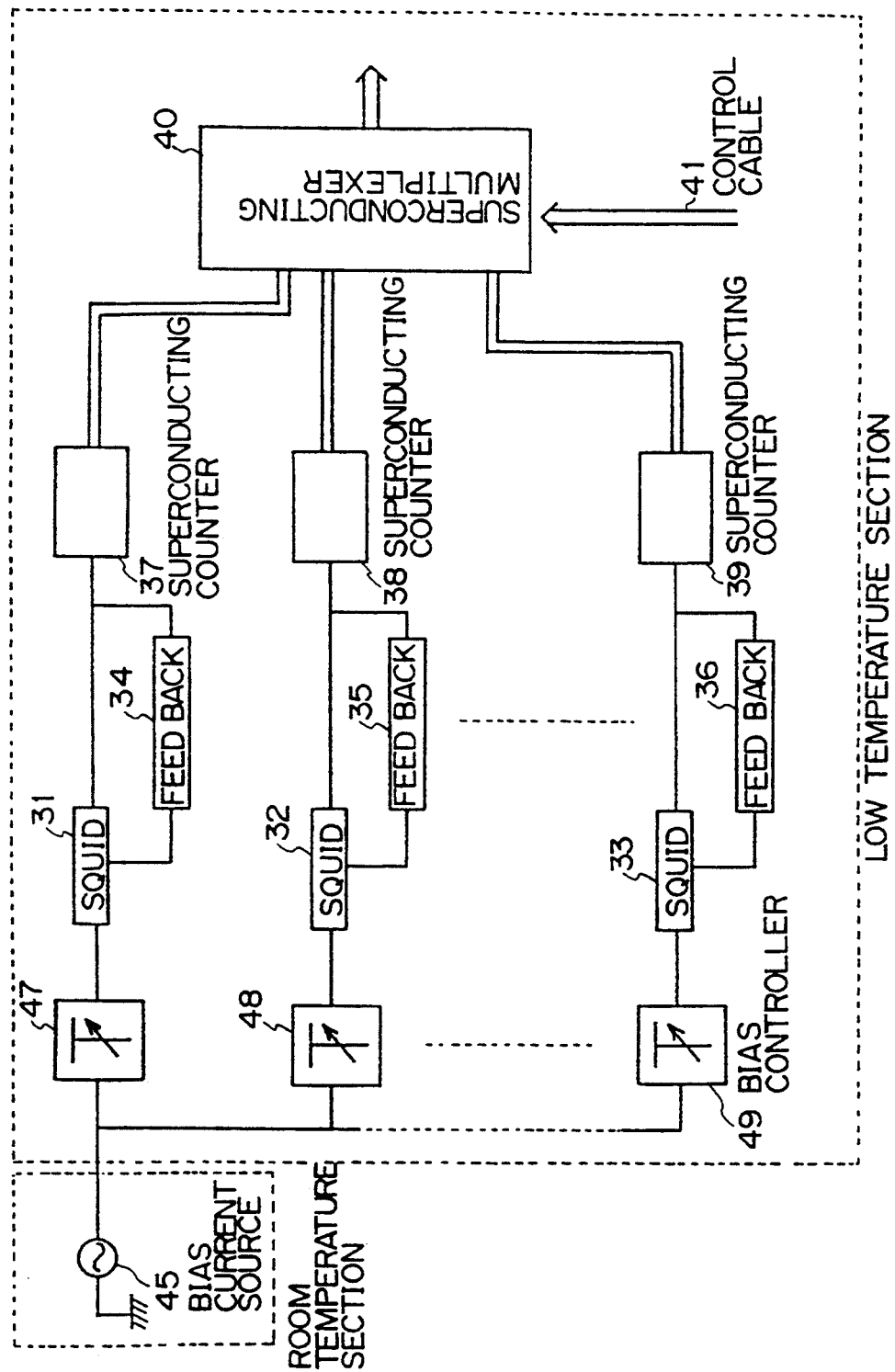
FIG. 6 illustrates an arrangement of a multichannel SQUID magnetometer according to a second embodiment of the present invention.

More specific arrangements of the basic arrangement shown in FIG. 3 are illustrated in FIGS. 5 and 6. In the following description, like reference characters are used to denote circuit blocks corresponding to those in the basic arrangement of FIG. 3.

FIG. 5 illustrates an n-channel SQUID magnetometer according to a first embodiment of the present invention in which a single bias current source 45 is provided and the bias current source and bias regulators 42, 43 and 44 are placed in the room-temperature environment. Each of the bias regulators 42, 43 and 44 is adapted to regulate the magnitude of a bias current for generating in the corresponding SQUID a radio-frequency magnetic field to measure an input magnetic field to fit the characteristics of the SQUID.

The superconducting multiplexer 40 is responsive to control signals received through a control cable 41 to multiplex the pulse counts output from the superconducting counters 37, 38 and 39 together and output them.

In the present embodiment, the SQUIDs are supplied with their respective bias currents from the common bias current source 45. Thus, a single bias current source suffices even if the number of channels is increased.

Assuming the number of bits in each superconducting counter is m, the signal lines may comprise n lines for supplying bias currents to the n-channel SQUIDs, m lines for outputting pulse counts and $\log_2 n$ lines for controlling the multiplexer.

Next, FIG. 6 illustrates an arrangement of an n-channel SQUID magnetometer according to a second embodiment of the present invention in which the bias regulators 47, 48 and 49 are each constructed from a superconducting circuit or an HEMT and placed in the low-temperature environment.

In this embodiment, since the n bias regulators 47, 48 and 49 placed in the low-temperature environment are supplied with bias currents from the common bias source 45, a signal line is sufficient to connect the bias current source 45 in the room-temperature environment to the bias regulators in the low-temperature environment. That is, the number of signal lines can be reduced and the consumption of a coolant, which is used to avoid an increase in temperature in the low-temperature environment due to the use of these signal lines, can be reduced.

According to the above embodiments, superconducting counters and a superconducting multiplexer are used and a plurality of SQUID flux sensors are operated simultaneously, so that multipoint simultaneous measurements can be made with accuracy and immediate response of the SQUID flux senfors even if the number of channels is increased.

Also, where a single bias source is used and bias regulators are placed in the low-temperature environment, the number of signal lines connecting the room-temperature environment to the low-temperature environment can be reduced.

The above embodiments are described in connection with digital SQUIDs for producing pulses corresponding to external magnetic flux density. The present invention may be applied to analog SQUIDs. For example, if an analog output of a SQUID is converted to a corresponding number of pulses, a large number of SQUIDs can be switched to realize multichannel measurement as in the above embodiments.

Next, a second basic arrangement of the present invention will be described with reference to FIG. 7.

In this embodiment, output data of n-channel flux sensors 51 is multiplexed by a multiplexer 54 for conversion to serial data and the serial data is converted by a multiplexer 55 placed in the room-temperature environment to parallel data. The parallel data is used to obtain a magnetic flux signal detected by each flux sensor.

Figure 7:
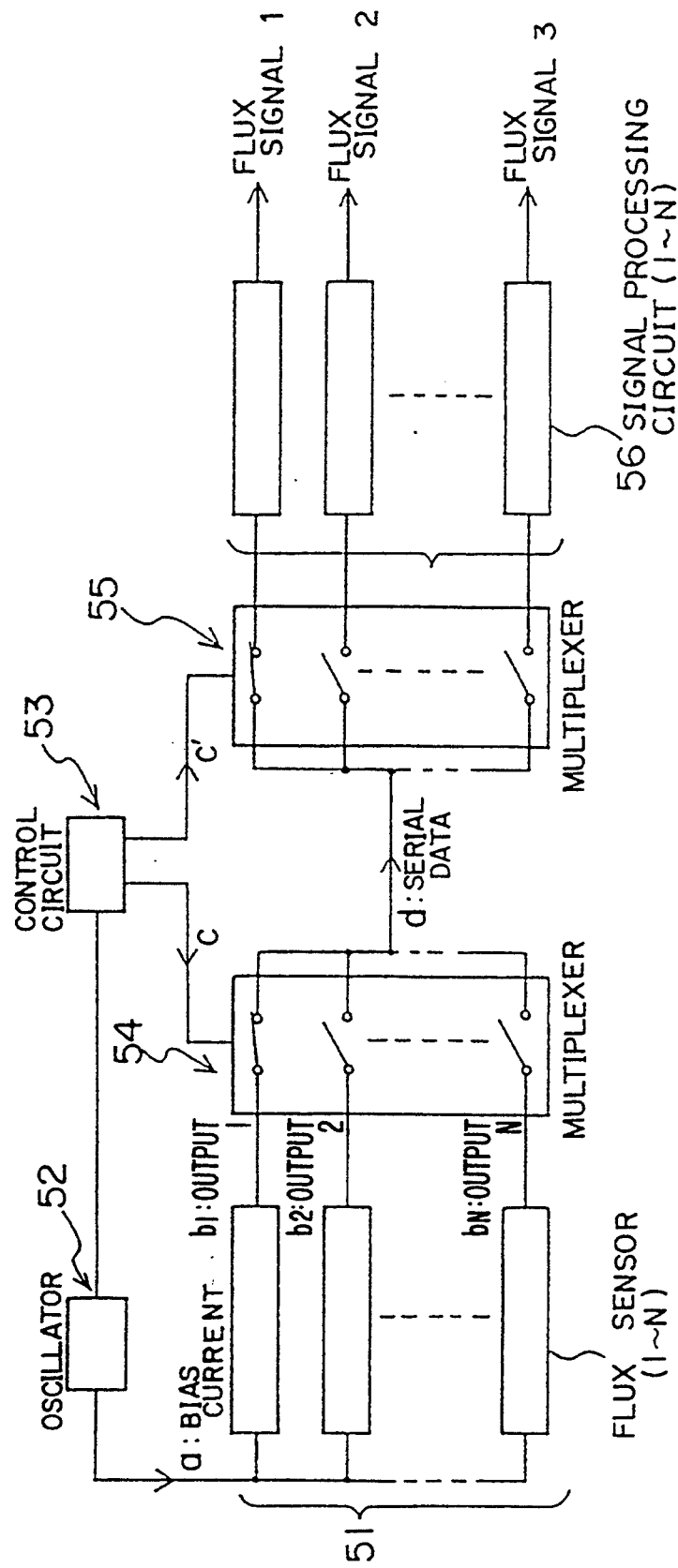
FIG. 7 illustrates a second basic arrangement of the present invention.

In the configuration shown in FIG. 7, there are provided a plurality of magnetic flux sensors 51 each of which is constructed from a SQUID for converting biomagnetism to an electric signal. An oscillator 52 supplies a bias current to the flux sensors 51 for pulse operation of the SQUID. A control circuit 53 supplies switching signals to the multiplexers 54 and 55. The multiplexer 54 combines outputs of the flux sensors 51 into serial data. The multiplexer 55 is also a multiplexer adapted to convert the serial data to parallel data and may be called a demultiplexer in terms of its function. Signal processing circuits 56 are adapted to extract a flux signal from an electric signal (a detected signal) and have a one-to-one correspondence with the flux sensors 51.

Here, the principle of operation of an SQUID (digital SQUID) will be described with reference to FIG. 8.

Figure 8:
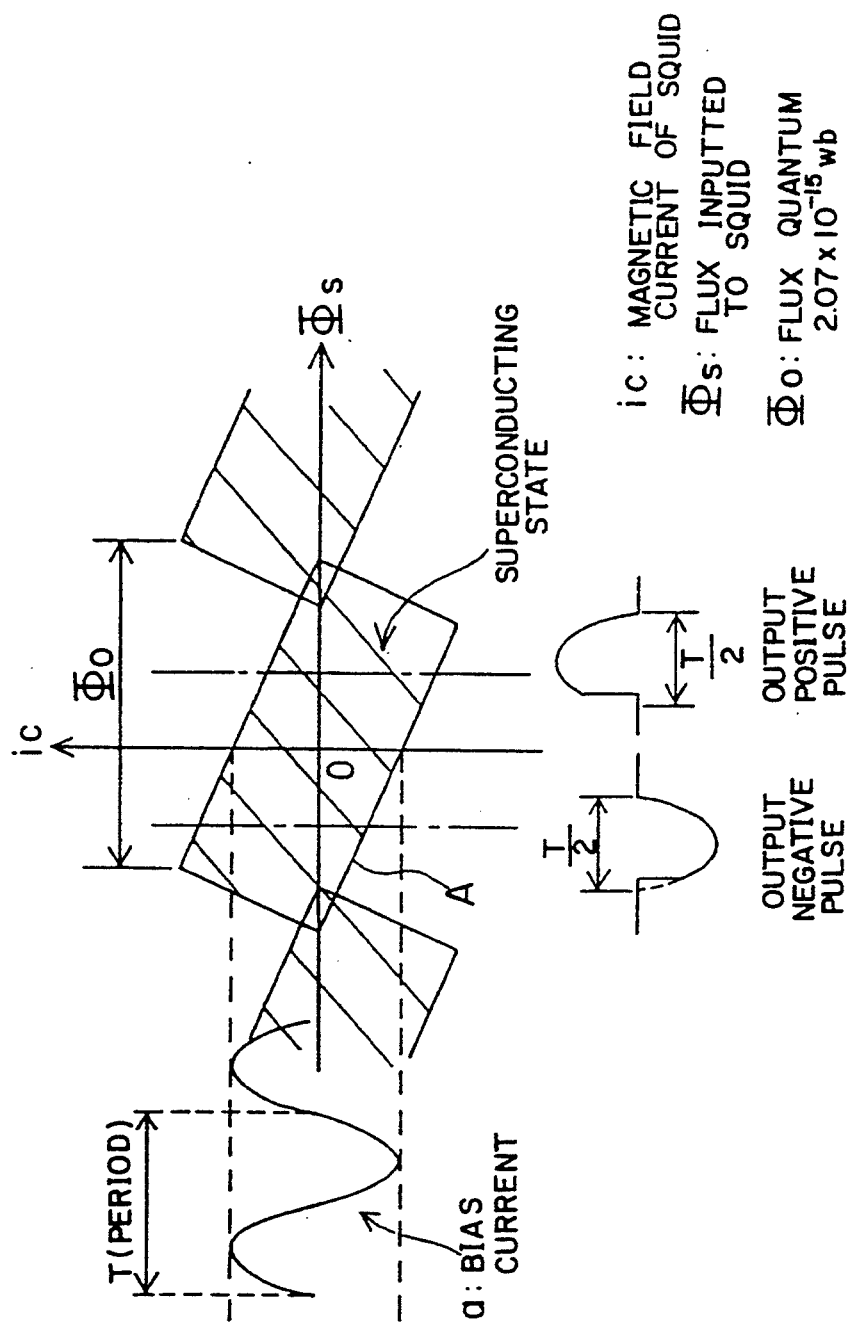
FIG. 8 is a diagram for use in explanation of a SQUID sensor.

FIG. 8 shows input magnetic flux $\Phi s$ versus magnetic field current in the SQUID (threshold characteristic). Lines A indicate the threshold characteristic of the SQUID. The SQUID is in the superconducting state when it is within the region enclosed by the lines A and indicated by oblique lines and in the voltage state when it is outside the region enclosed by the lines A. In the voltage state the SQUID outputs pulses.

With the magnitude of bias current a applied to the SQUID set equal to the critical current when input magnetic field $\Phi s=0$, the SQUID produces positive pulses or negative pulses in accordance with the polarity of the input magnetic field. Since the threshold characteristic is asymmetrical, one positive or negative pulse is output from the SQUID within the period T of the bias current.

Note that the magnitude of the input magnetic flux $\Phi s$ is the level indicated by the dash-dotted lines in FIG. 8 and a pulse output from the SQUID has a duration of at least T/4, depending on the magnitude of the input magnetic flux.

Figure 9:
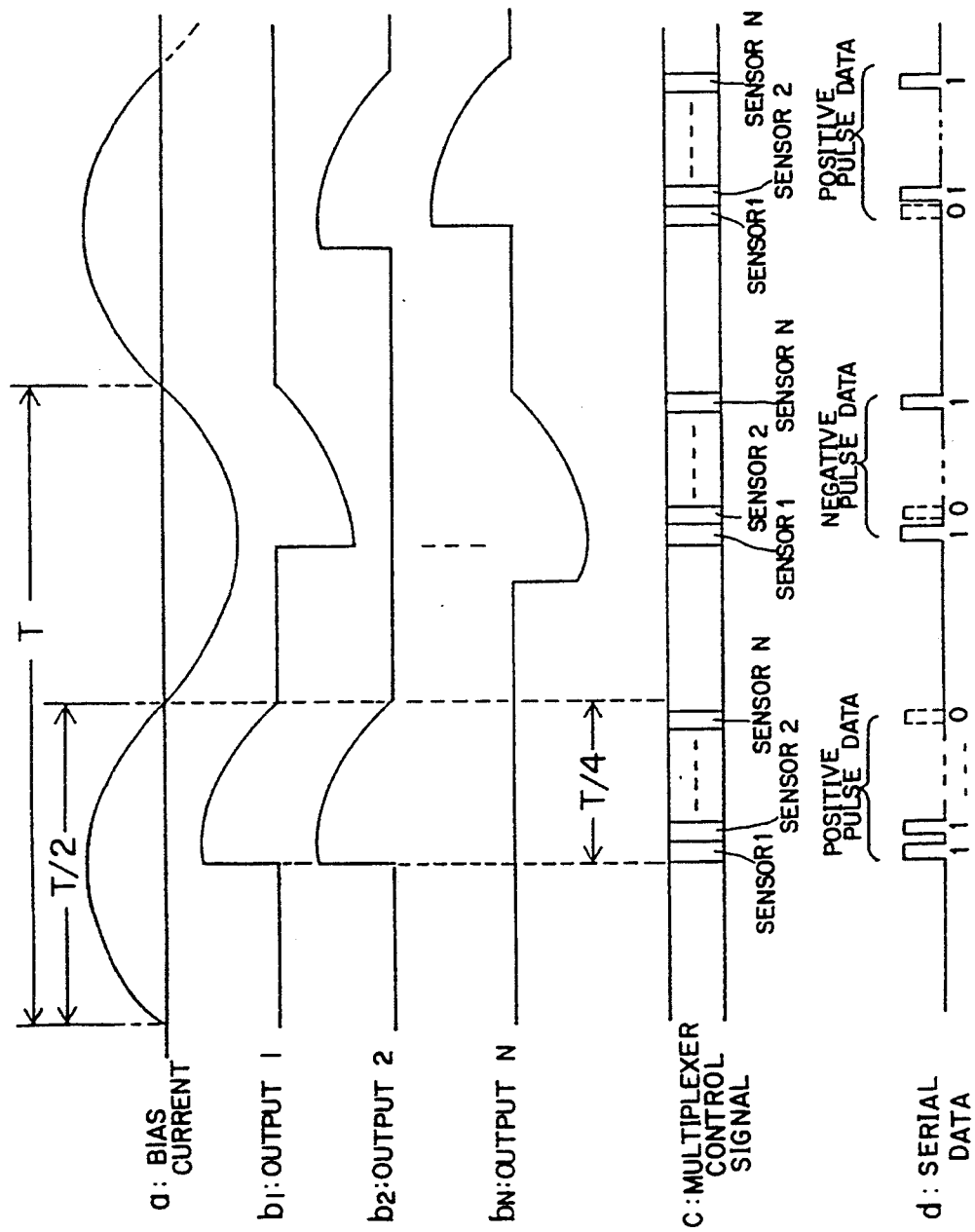
FIG. 9 is a timing diagram which is useful in understanding the operation of the circuit of FIG. 7.

Next, on the above premise the operation of the multichannel SQUID magnetometer of FIG. 7 will be described with reference to a timing chart of FIG. 9.

The oscillator 52 supplies a bias current a having a relatively low frequency of, say, 1 MHz to each of the flux sensors 51. Pulse outputs b1–bN from the flux sensors 51 (1–N) corresponding to regions for biomagnetism measurement are multiplexed in the multiplexer 54 by control signals c from the control circuit 53 during the half period of the bias current a (actually ¼ period), so that they are converted to serial data d. Subsequently, the serial data d is transferred to the multiplexer 55 placed in the room-temperature environment through a single output signal line. The serial data is converted to parallel data by the multiplexer 55 in response to control signals c' synchronized with the control signals c applied to the multiplexer 54. The parallel data is fed into the signal processing circuits 56 corresponding to the flux sensors 51. This operation is repeated during a time interval when the bias current is applied, so that time-series data is obtained for each of the flux sensors 51 by a corresponding signal processing circuit 56. The time-series data is converted to a magnetic flux signal for each of the measured regions.

As described above, since each of the flux sensors 51 is constantly operating during a time interval when the bias current a is applied thereto (the on/off measurement of pulses is made every T/2, the half period of the bias current), the flux sensors 51 operate as if they constitute one channel. Thus, even if the number of channels is increased, no problem arises in connection with the response of the individual SQUIDs. Moreover, since output lines are combined into one output line by the use of the multiplexers 54 and 55, the consumption of a coolant, such as liquid helium, used to cool down the SQUIDs can be reduced.

Next, the second basic arrangement of the present invention shown in FIG. 7 will be described more specifically with reference to FIGS. 10 through 29.

In the following description, like reference numerals are used to denote circuit blocks corresponding to those shown in FIG. 7 and their descriptions are omitted.

Figure 10:
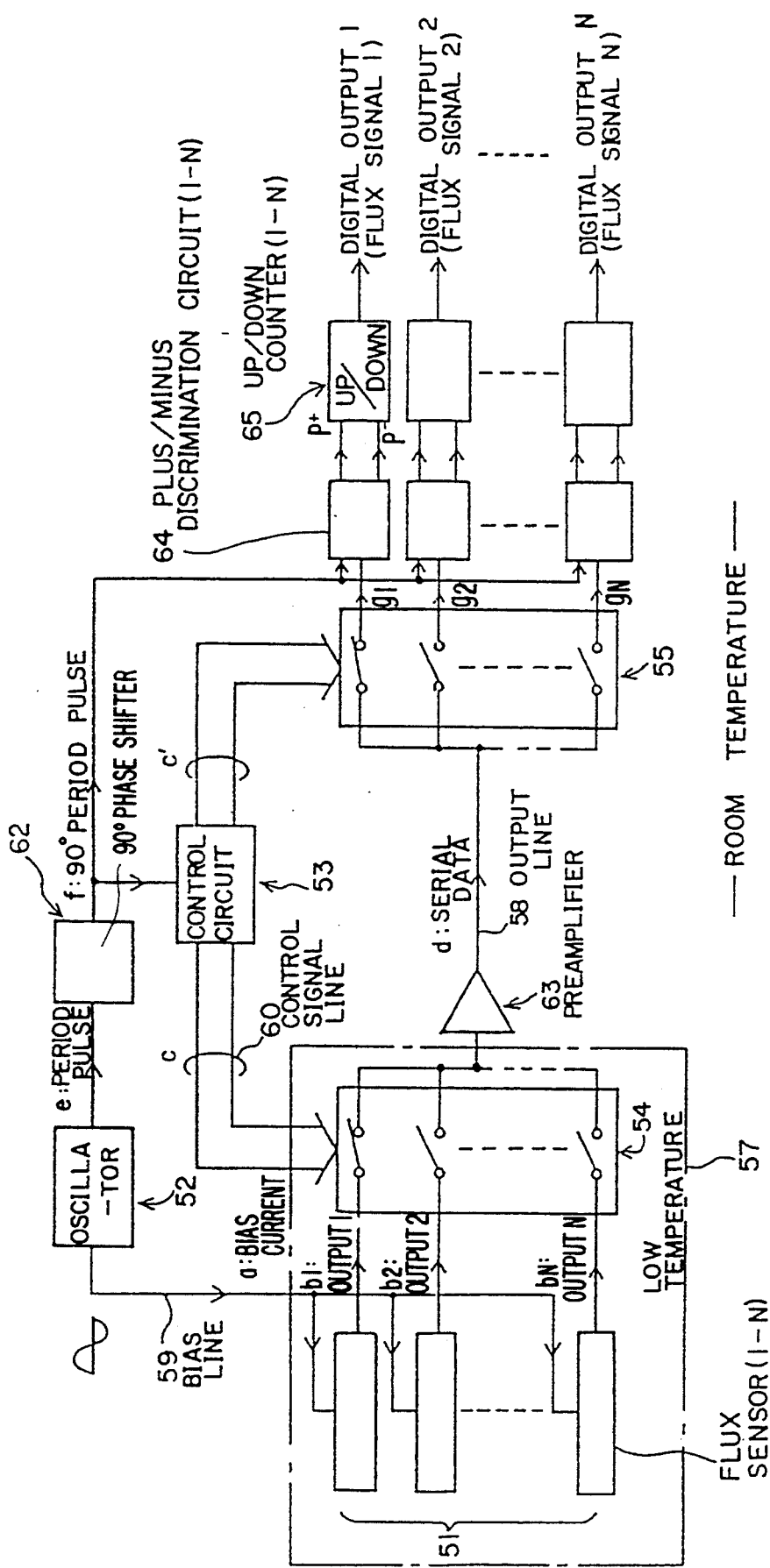
FIG. 10 illustrates an arrangement of a multichannel SQUID magnetometer according to a third embodiment of the present invention.

FIG. 10 illustrates a third embodiment of the present invention in which the flux sensors 51 are supplied with a bias current at the same time and a superconducting feedback circuit is incorporated into each of the flux sensors 51.

In this embodiment, the flux sensors 51 and the multiplexer 54 are placed in a cryostat 57 so that they are cooled down by a coolant such as liquid helium. With respect to this point the other embodiments to be described later are also the same as this embodiment.

Moreover, in this embodiment, in order to operate the flux sensors 51 continuously during measurement in accordance with the present invention, the bias current a is supplied continuously to the sensors and feedback inputs are applied continuously to the sensors without being cut off by selectors when measurement is made, so that the outputs of the flux sensors are applied continuously to the multiplexer 54. With respect to this point the other embodiments to be described later are also the same as this embodiment.

With respect to cables extending from the cryostat to the room-temperature environment, a single signal output line 58 suffices owing to the provision of the multiplexer 54. Assuming the number of the flux sensors 51 to be N, the number of control signal lines 60 extending from the control circuit 53 will be $\log_2 N$ in the case of FIG. 15, 5 lines in the case of FIG. 18, and 4 lines in the case of FIG. 19. The number of feedback lines is zero because each of the flux sensors incorporates a feedback circuit. The consumption of liquid helium can be reduced as a whole.

Figure 11:
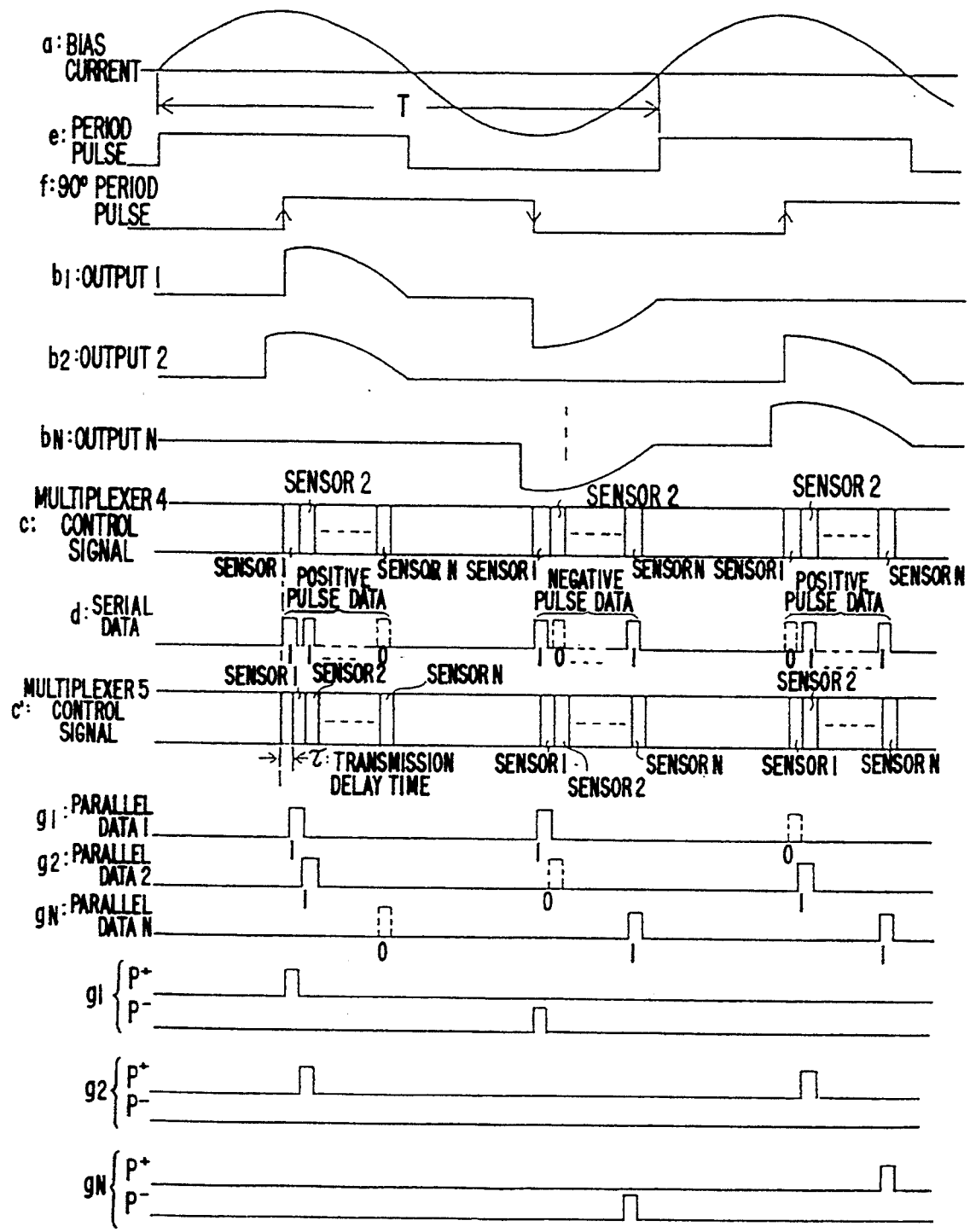
FIG. 11 is a timing diagram which is useful in understanding the operation of the circuit of FIG. 10.

The arrangement and operation of the third embodiment of FIG. 10 will be described with reference to a timing diagram of FIG. 11.

In FIG. 10, the oscillator 52 supplies a sinusoidal bias current with a period of, for example, T to the flux sensors and a sync pulse in phase with the bias current to a 90-degree phase shifter 62. It is to be noted that a sinusoidal current is not necessarily needed for the bias current. The waveform of the bias current has only to be such that output pulses of all the flux sensors, which are output in response to input magnetic flux Φs, are sustained while they are being multiplexed by the multiplexer 54.

The 90° phase shifter 62 shifts the phase of the sync pulse e by 90° to form a 90° sync pulse f. The pulse f is applied to the control circuit 53 and plus/minus discriminators 64.

The control circuit 53 supplies multiplexer control signals C and C' comprised of signals A1 to Am to the multiplexers 54 and 55 synchronously with the bias current a using the pulse f. The control signal C' is delayed from the control signal C by $\tau$, which is a propagation delay time of the cable.

The timing of the operation of the multiplexer 54 is delayed from the bias current a by 90°. That is, the multiplexer 54 starts its operation at a point of time when all the flux sensors 51 terminate their pulse outputs. Thereby, even if the multiplexer 54 is switched at high speed, the SQUIDs can be prevented from malfunctioning due to crosstalk therebetween.

The flux sensors 51 output pulses indicated by b1 to bn. Each of the output pulses has a duration of more than $\frac{1}{4}$ of the period of the bias current a. By sampling these output pulses b1 to bn of all of the flux sensors 51 by the multiplexer 54 within the pulse duration, serial data d is obtained as shown in FIG. 11. The sampling is initiated in synchronism with the rise of the 90° sync pulse f and terminates within T/4. The serial data d is amplified by a preamplifier 63 and then sent to the multiplexer 55, whereby the S/N ratio can be improved.

The multiplexer 55 is responsive to the control signal C' to convert the serial data d to parallel data g1 to gn. Each piece of the parallel data g1 to gn is applied to a corresponding one of the signal processing circuits 56. The parallel data g1 to gn has mixed positive and negative pulses. Note that the control signal C' may be coincident in time with the control signal C. Instead of obtaining the control signals C' from the control circuit 53, sync clocks which can be extracted from the serial data d by the use of a PLL (phase locked loop) may be used as the control signal C'.

Each of the signal processing circuits 56 is comprised of a plus/minus discrimination circuit 64 and an up/down counter 65.

The plus/minus discrimination circuit 64 discriminates plus and minus of a corresponding piece of the parallel data g using the 90° sync pulse f. Data g when the sync pulse f is at a 1 produces a positive pulse P+, while data g when the sync pulse f is at a 0 produces a negative pulse P−. The positive pulse and the negative pulse are applied to the up input and the down input of the up/down counter 65, respectively. In this way a magnetic signal can be obtained as digital data for each of the flux sensors 51. That is, by counting pulse outputs b1 to bn, which result from feedback within the flux sensors 51, magnetic flux digital data is obtained.

Instead of the plus/minus discriminator 64 and the up/down counter 65, an analog integrator may be used. Needless to say, a D/A converter may be provided after the up/down counter 65.

Next, the flux sensors 51 and the multiplexer 54 shown in FIG. 10 will be described in detail with reference to FIGS. 12 through 20.

In this embodiment, the flux sensor 51 incorporates a feedback circuit and is constructed from a sensor 66 using a SQUID (hereinafter referred to as a SQUID sensor) and a superconducting feedback circuit 68 in the form of one chip.

Figure 12:
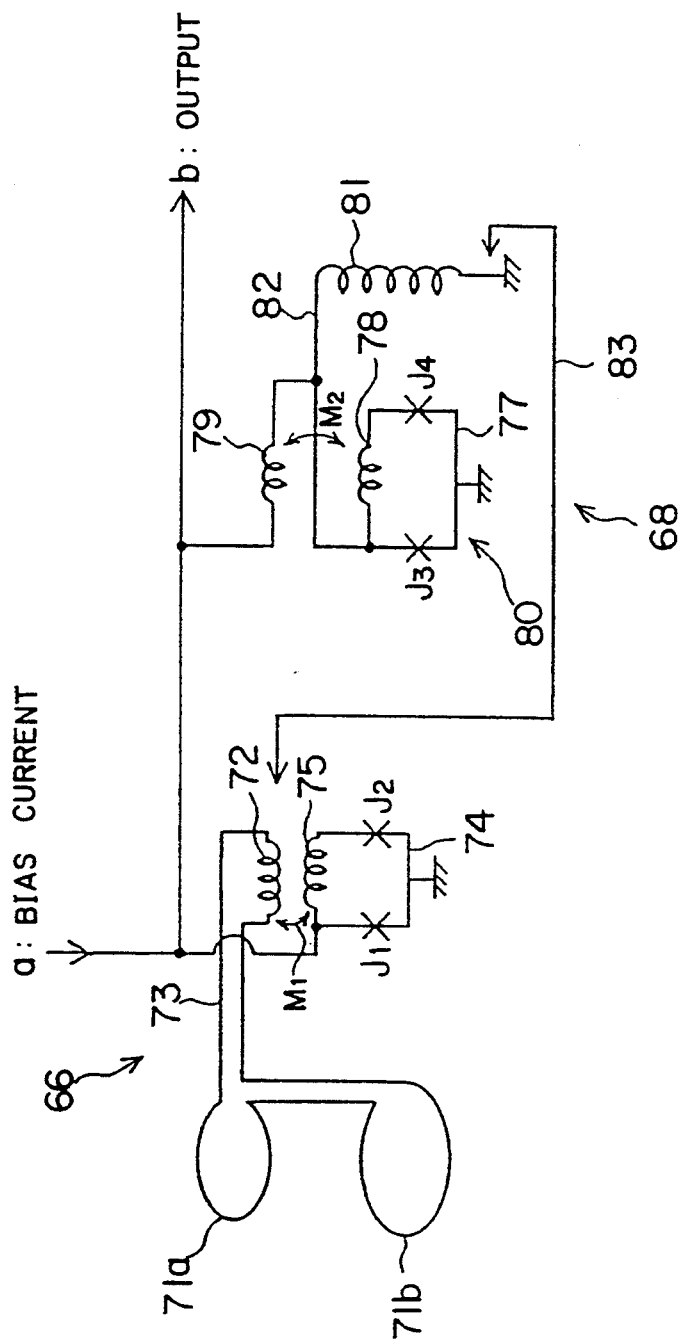
FIGS. 12, 13 and 14 illustrate arrangements of magnetic flux sensors.

FIG. 12 illustrates an exemplary arrangement of the flux sensor 51. In the figure, 71a and 71b denote a pair of pickup coils for picking up external magnetic flux to be measured, which are formed of a superconducting loop, and 72 denotes an input coil for transferring magnetic flux produced in the superconducting loop 73 to a superconducting inductance 75.

The SQUID sensor 66, which is a two-junction quantum interference device operating with an ac bias, has a superconducting loop 74, Josephson junctions J1 and J2 and superconducting inductance 75 in addition to the pickup coils 71a and 71b and the input coil 72. The SQUID sensor 66 converts magnetic flux corresponding to a difference between the magnetic flux Φs to be measured from the input coil 72 and the feedback magnetic flux ΦFB to pulses in accordance with the ad bias current a and outputs the pulses corresponding to the input magnetic flux (Φs-ΦFB) to the feedback circuit 68. That is, the SQUID sensor produces and outputs a pulse train depending on the input magnetic flux.

The feedback circuit 68 is constructed from a superconducting loop 77 consisting of Josephson junctions J3 and J4 and a first inductance 78, a second inductance magnetically coupled (coupling coefficient M) with the first inductance 78, a write gate 80 converting pulses output from the SQUID sensor 66 to flux quanta, and a superconducting storage loop 81 consisting of a superconducting inductor 81 and storing pulses passing through the write gate 80 as flux quanta.

The feedback circuit 68 measures the number of pulses output from the SQUID sensor 66 and feeds flux quanta corresponding to the result of the measurement back to the input side through a feedback loop 83 which is magnetically coupled with the SQUID sensor 66.

That is, when the SQUID sensor 66 produces a train of pulses in accordance with the input magnetic flux, the pulses are counted by the feedback circuit 68 and the feedback magnetic flux corresponding to the pulse count is fed back to the SQUID sensor 66. As a result, feedback is provided always so as to cancel out the magnetic flux Φs to be measured detected by the pickup coils 71a and 71b, whereby the magnitude of the magnetic flux Φ can be known from the amount of feedback.

Figure 13:
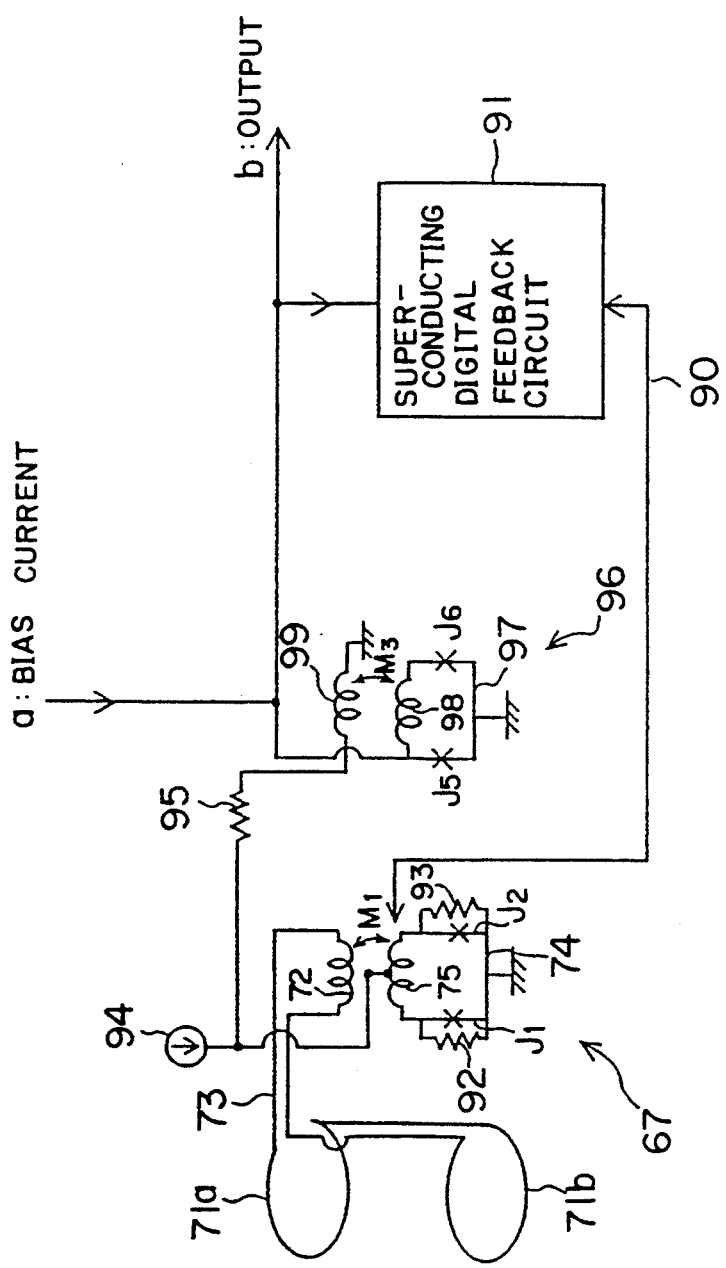

FIG. 13 illustrates an analog dc SQUID sensor used as the flux sensor 51. In this figure, like reference characters are used to denote parts corresponding to those shown in FIG. 12.

In SQUID sensor 67 shown in FIG. 13, resistors 92 and 93 are provided in parallel with the Josephson junctions J1 and j2, respectively. The magnetic flux corresponding to a difference between the magnetic flux Φs to be measured from the input coil 72 and the feedback magnetic flux ΦFB is converted to a voltage by a dc bias current 94 and the resulting voltage is output to a superconducting comparator 96 via a resistor 95.

The superconducting comparator 96 has Josephson junctions J5 and J6 and a first inductance 98 which are incorporated in a superconducting loop 97, and a second inductance 99 which is magnetically coupled (coupling coefficient=M3) with the first inductance 98. The superconducting comparator 96 compares the output of the SQUID sensor 67 with an ac bias current a and outputs digital current pulses to a superconducting digital feedback circuit 91. The superconducting digital feedback circuit 91 is adapted to count pulses output from the superconducting comparator 96 and feed the flux quanta corresponding to the pulse count back to the input side of the SQUID sensor 67 through magnetic coupling by feedback loop 90 and may comprise an up/down counter or a D/A converter, either of which is constituted by a Josephson circuit. The superconducting feedback circuit 91 may be further provided with a filter if necessary.

Figure 14:
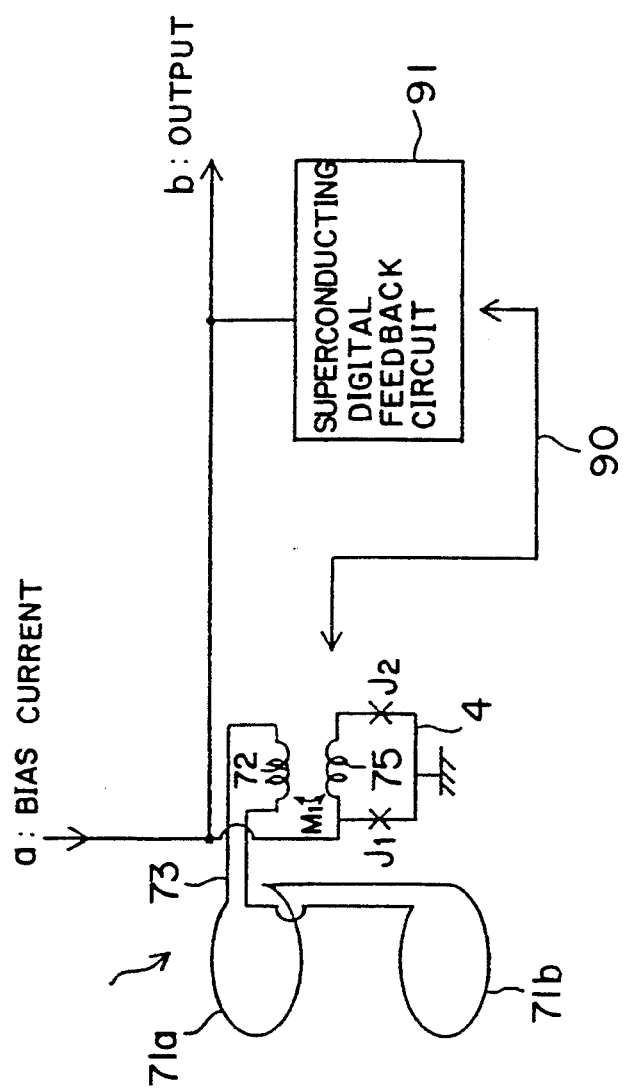

FIG. 14 shows an arrangement of the flux sensor 51 in which the digital SQUID sensor 66 of FIG. 12 is provided with the superconducting digital feedback circuit 91 of FIG. 13.

In this case, if the superconducting digital feedback circuit 91 and the SQUID sensor 66 are made integral with each other, then the feedback lines extending from the room-temperature environment to the low-temperature environment become unnecessary as in the above-described examples, thereby permitting a decrease in the consumption of the coolant.

Next, a specific arrangement of the multiplexer 54 will be described with reference to FIGS. 15 through 20.

Figure 15:
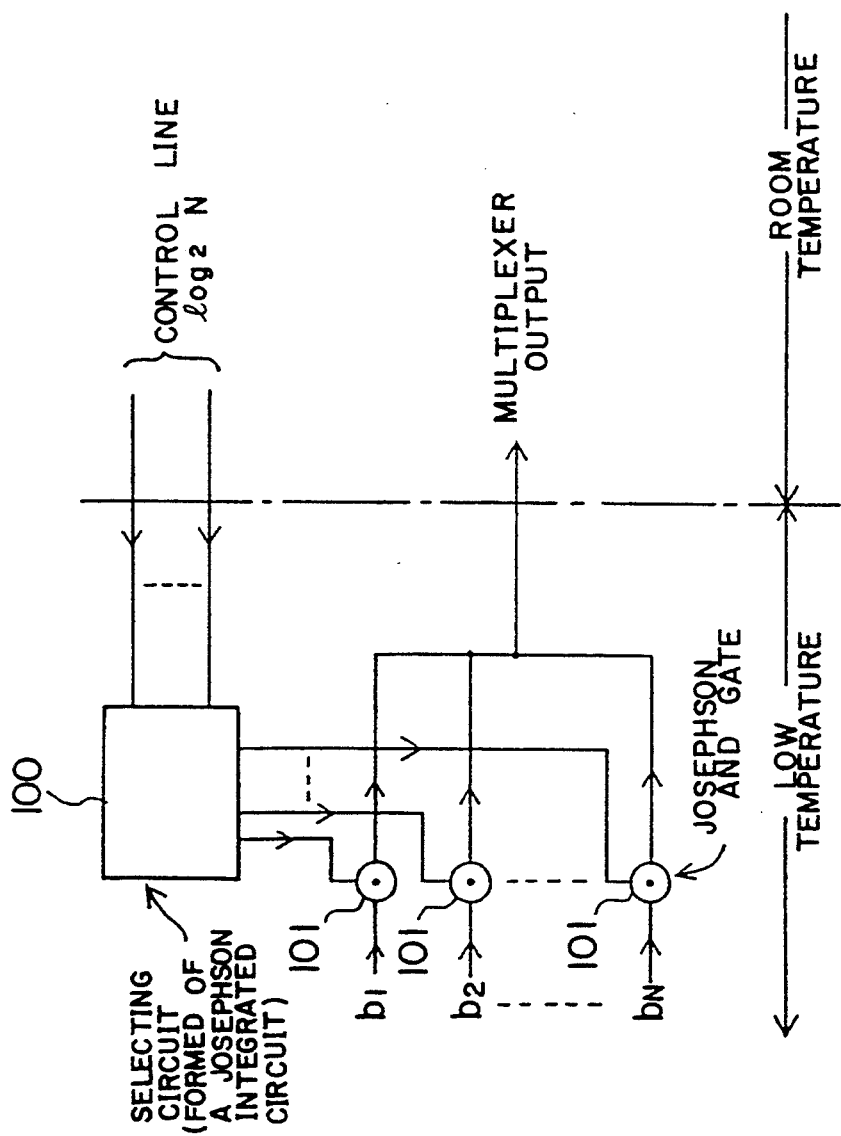
FIGS. 15, 16, 17, 18, 19 and 20 illustrate arrangements of the multiplexer used in the present invention.

In FIG. 15, the outputs b1–bN of the N flux sensors 51 are entered into respective individual Josephson logical product (AND) gates 101. The logical product gates 101 are supplied with select signals from a selecting circuit 100 formed of a Josephson integrated circuit, so that the outputs b1, b2, ..., bN are output in sequence from the logical product gates 101 to the multiplexer 55 (FIG. 10) placed in the room-temperature environment.

That is, the magnetic flux signals detected by the N flux sensors are multiplexed by the multiplexer 54 for transmission over a single output line.

Figure 16:
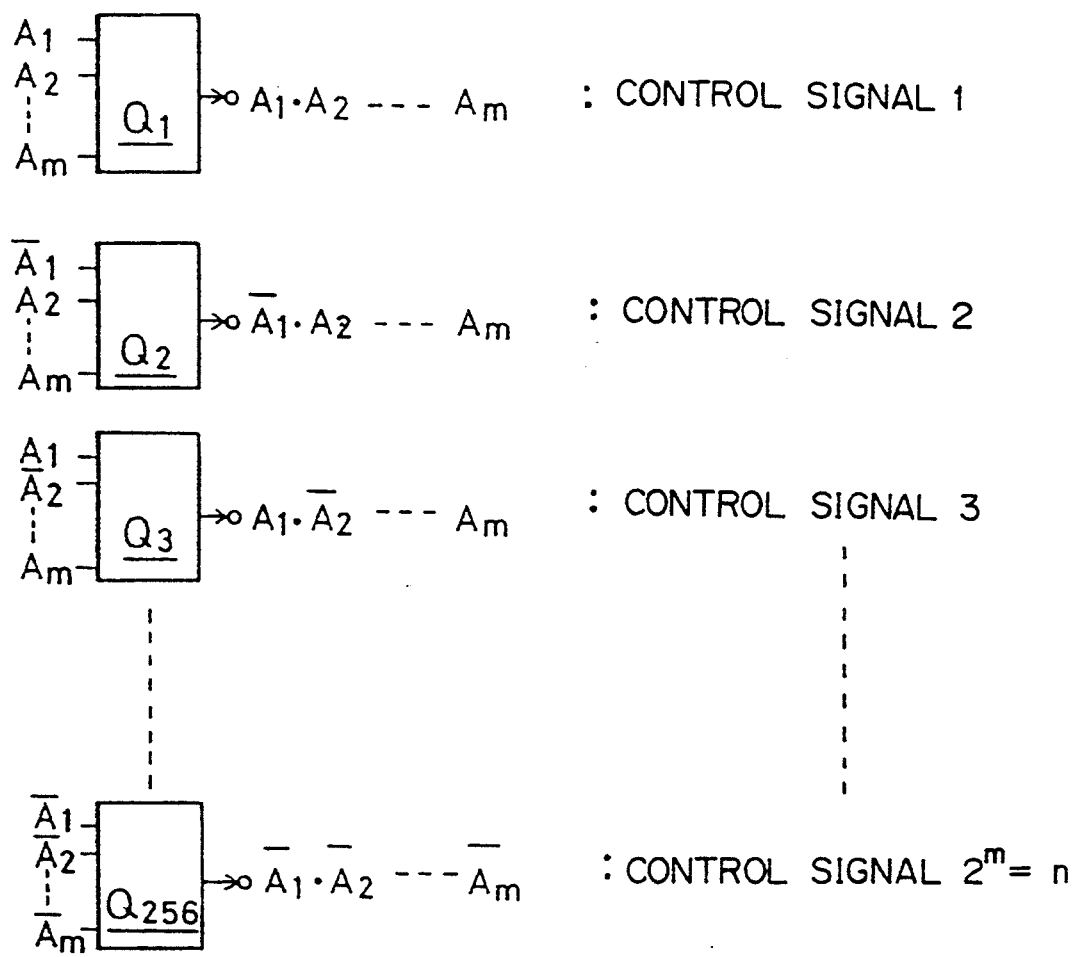

The selecting circuit 100 is, as shown in FIG. 16, constructed from 256 select gates Q1 to Q256. Each of the gates is supplied with a signal of eight bits A1 to Am from the external control circuit 53. The 8-bit signal can produce control signals 1 to N (=$2^m$) which are used to select the 256 logical product gates 101 in sequence.

Figure 17:
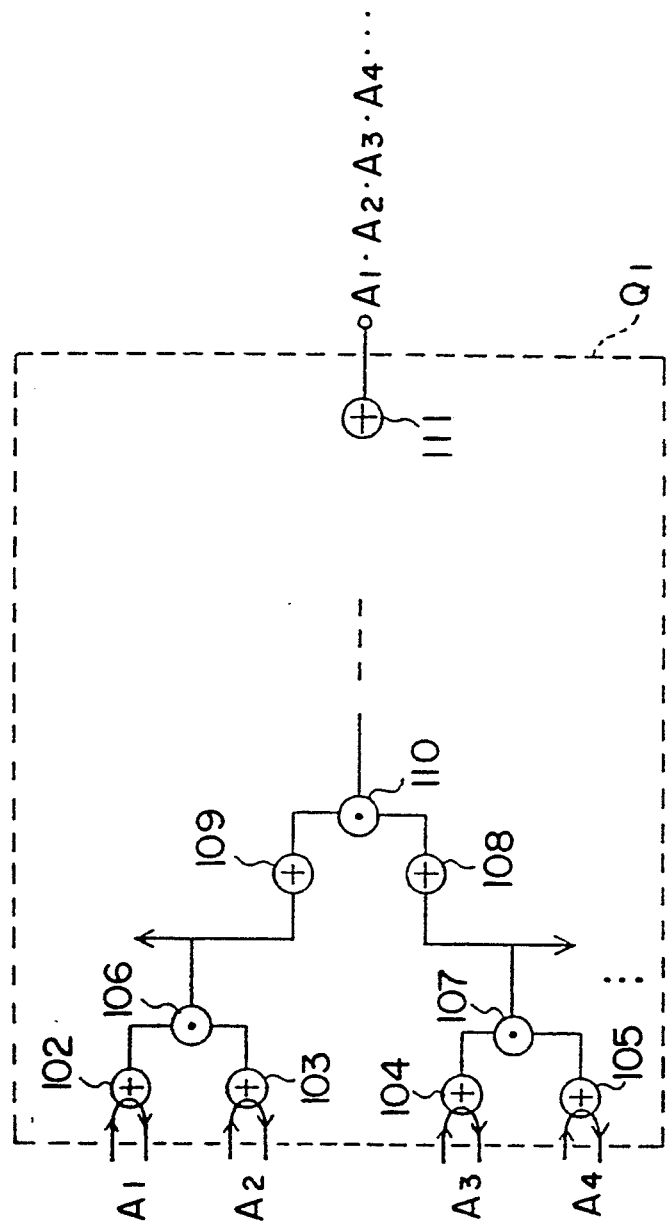

FIG. 17 illustrates an example of the select gate Q1. In this figure, the select gate is simplified as a 4-bit gate, although an 8-bit gate is actually intended. The select gate Q1 is comprised of Josephson logical OR gates 102 to 105, logical product gates 106 and 107, logical OR gates 108 and 109, a logical product gate 110, ..., and a logical OR gate 111 and produces a control signal expressed by the logical product of A1×A2×A3×A4. This control signal is applied to the logical product gate 101 of FIG. 15.

Figure 18:
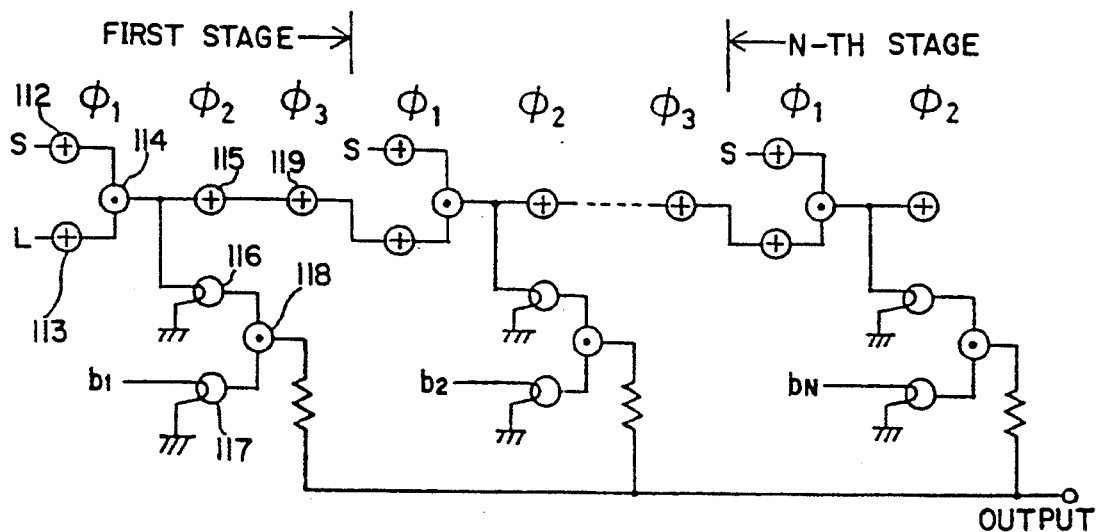
Figure 19:
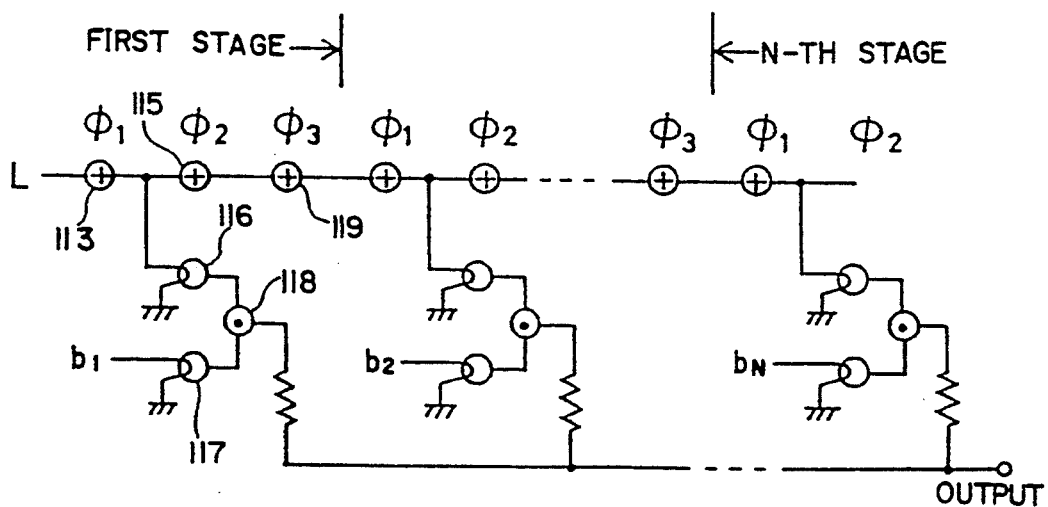

FIGS. 18 and 19 illustrate other arrangements of the multiplexer 54.

In FIG. 18, the multiplexer 54 is comprised of a shift register driven by a three phase clocks Φ1, Φ2 and Φ3. When a load signal L and a shift signal S are both 1s, logical OR gates 112 and 113 and a logical product gate 114 each output a 1 in synchronism with clock Φ1.

Next, in synchronism with clock Φ2 a logical OR gate 115 shifts the load signal L ("1"), a 3J logical OR gate 116 outputs a1 and a 3J logical OR gate 117 outputs the output b1 of the flux sensor 51. A logical product gate 118 outputs a logical product signal (in this case the output signal b1) of the outputs of the 3J logical OR gates 116 and 117 to the OUTPUT terminal. Subsequently a logical OR gate 119 shifts the load signal L to the next stage in synchronism with clock Φ3.

At the second stage and succeeding stages, the same operation as above is performed when the shift signal S is applied, so that the output signals b1, ... bN of the N flux sensors 51 are output in sequence to the OUTPUT terminal, i.e., they are multiplexed for transmission over a single signal line.

The reason why the output signals b1 to bN of the flux sensors 51 are applied to the 3J logical OR gates is to convert negative pulses output from the flux sensors to positive pulses for easier processing in succeeding circuits.

FIG. 19 illustrates another arrangement of the multiplexer which is the same as the arrangement of FIG. 18 except that the input circuits for the shift signal S are removed.

In the arrangement of FIG. 19, by shifting the load signal L synchronously with the clocks Φ1 to Φ3, the output signals b1 to bN of the N flux sensors 51 are converted to serial data.

Figure 20:
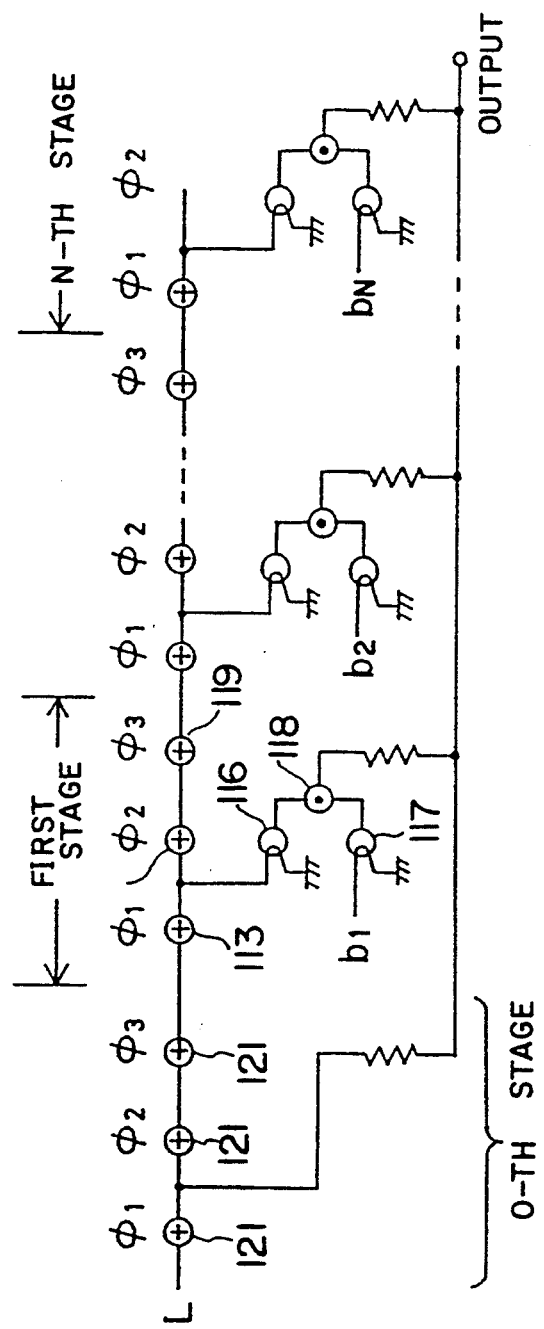

Furthermore, FIG. 20 illustrates still another arrangement of the multiplexer in which the first stage of FIG. 19 is preceded by a stage (hereinafter referred to as the 0th stage) having a series combination of three logical OR gates 121 which operate in response to the three phase clocks Φ1, Φ2 and Φ3.

In this case, when the load signal L goes to a1, it is output from the first logical OR gate 121 to the OUTPUT terminal in synchronism with the first clock Φ1. After the load signal L has been shifted from the 0th stage into the first stage, the output signal b1 of the first-channel flux sensor 51 is output from the first stage to the OUTPUT terminal. Subsequently, the output signals b2, ..., bN are output in sequence.

In the circuit arrangement of FIG. 20, therefore, an output pulse at a1 (hereinafter referred to as a MARK signal) is certain to be obtained prior to the output signal b1 of the first flux sensor 51. Thus, by providing a circuit for detecting the MARK signal before or within the multiplexer 55 (FIG. 10) for receiving the serial data from the multiplexer 54 and triggering the control signal C' by the MARK signal, it becomes possible to control the timing of the receiving of the serial data with ease. That is, it becomes possible to delay the control signal C' easily by the propagation time of the serial data transmitted over the output line 58.

Note that the 0th-stage circuit (including an output resistor) need not necessarily be provided before the first stage. The circuit or circuits may be provided at a predetermined stage or stages from the first stage to the Nth stage. By containing one or more bits at a high level in an output pulse train in this way, it becomes possible to determine the timing of the control signal C' of the multiplexer 55 on the basis of the bit information. Several circuits corresponding the 0th stage may be provided so that the logical product of their outputs is used as a trigger pulse. By obtaining the logical product of the MARK signals, the operational reliability of the multiplexer 55 can be improved further with respect to determination of the timing of the receiving of the serial data.

FIGS. 21 through 26 illustrate other specific embodiments of the second basic arrangement of the present invention shown in FIG. 7.

Figure 21:
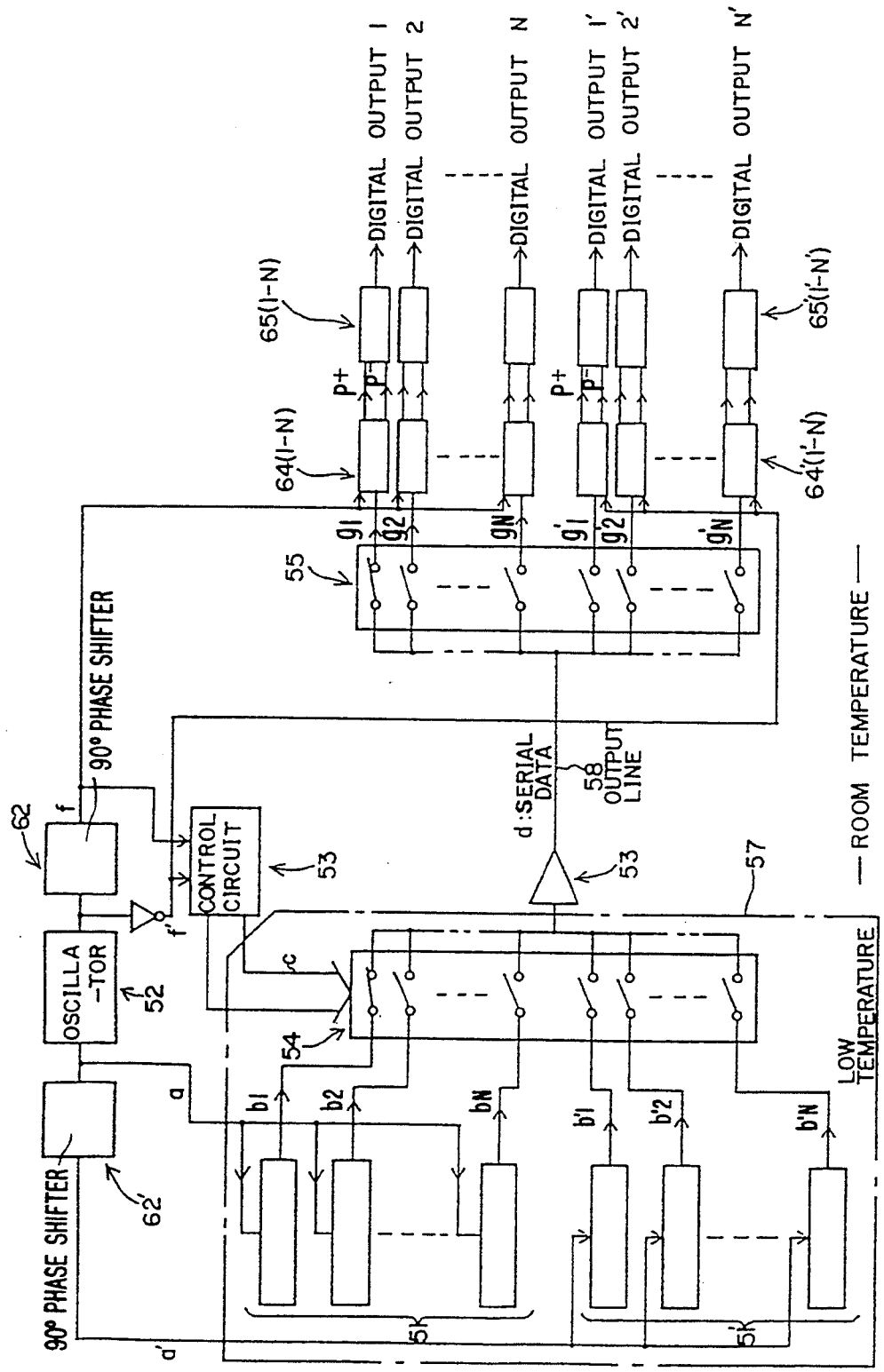
FIG. 21 illustrates an arrangement of a multichannel SQUID magnetometer according to a fourth embodiment of the present invention.

FIG. 21 illustrates the arrangement of a multichannel SQUID magnetometer according to a fourth embodiment of the present invention in which two sets of flux sensors 51 and 51', each having N flux sensors (1–N), are provided which differ from each other in timing of receiving of their respective bias currents.

In this embodiment, the flux sensors 51 are supplied with the bias current a as in the embodiment shown in FIG. 10, while the flux sensors 51' are supplied with a bias current a' 90° out of phase with the bias current a. Hence, provision is made of a 90° phase shifter 62' for shifting the phase of the bias current a by 90°. A signal f 90° out of phase with the sync pulse e and a signal f' 180° out of phase with the sync pulse e are supplied to the control circuit 53. The former signal f serves as a sync pulse corresponding to the bias current a, while the latter signal f' serves as a sync pulse corresponding to the bias current a'.

The control circuit 53 is, on the one hand, responsive to the signal f to produce control signals used to sample the output signals b1 to bN of the flux sensors 51 and apply them to the multiplexer 54 and, on the other hand, responsive to the signal f' to produce control signals for sampling the output signals b1', ..., bN' of the other flux sensors 51' and apply them to the multiplexer 54.

Figure 22:
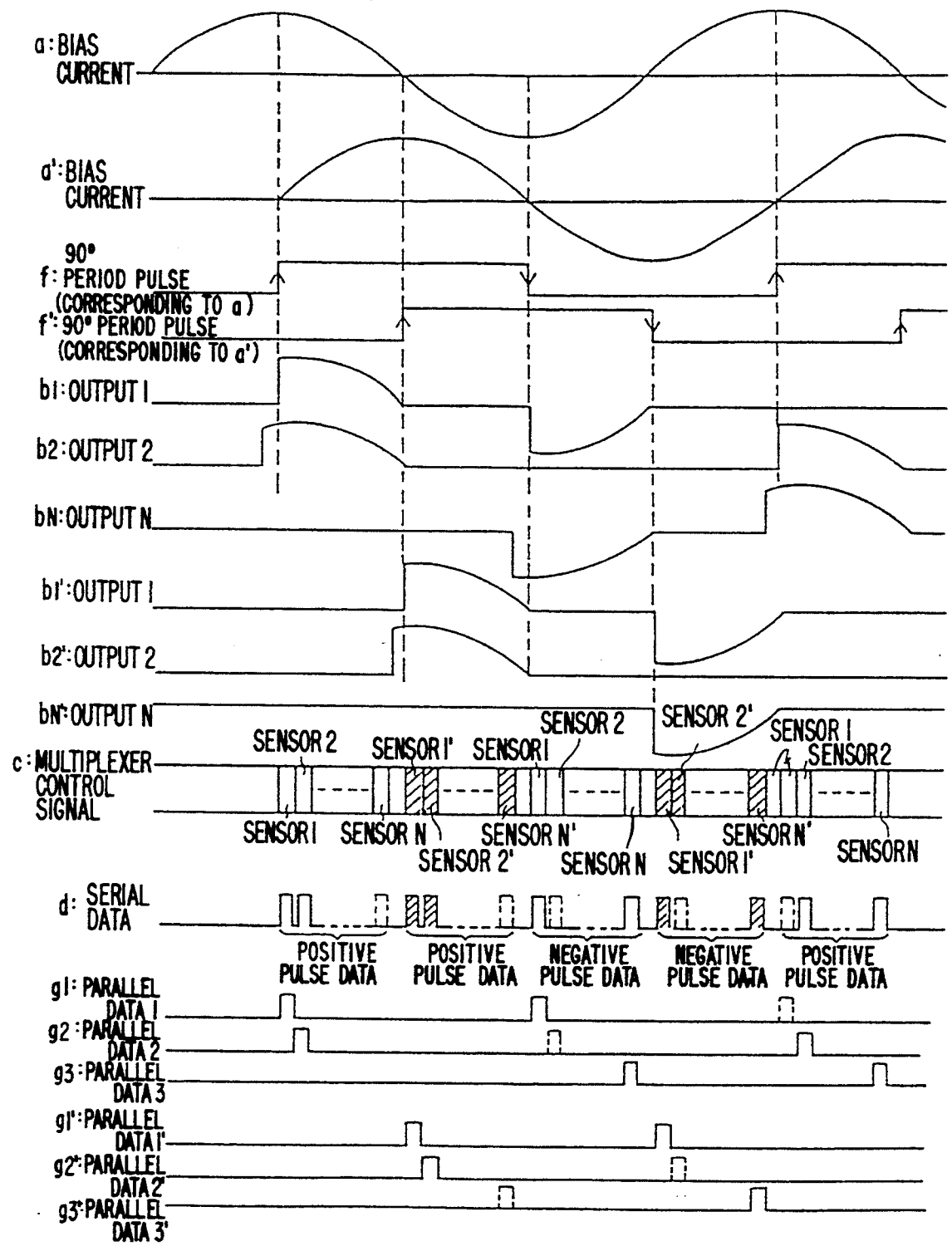
FIG. 22 is a timing diagram which is useful in understanding the operation of the SQUID magnetometer of FIG. 21.

As a result, as can be seen from the timing diagram of FIG. 22, the output signals b1 to bN of the flux sensors 51 are multiplexed during ¼ period of the bias current a when it is positive, while the output signals b1', ..., bN' of the flux sensors 51' are multiplexed during ¼ period of the bias current a' when it is positive. The serial data d is consequently sent out onto the output line 58.

The plus/minus decision circuits 64' corresponding to the flux sensors 51' are responsive to the signal f' to decide the plus or minus sign of respective individual bits of parallel data g1', ..., gN' output from the multiplexer 55.

In this embodiment, no control signals are supplied from the control circuit 53 to the multiplexer 55. Instead, sync clocks are extracted from the serial data d by the use of a PLL, for example, and used for serial-to-parallel conversion in the multiplexer 55.

According to the fourth embodiment, by supplying two sets of flux sensors with bias currents a and a' having the 90° phase difference therebetween as described above, the number of flux sensors which can be driven by the multiplexer 54 can be doubled. This provides an advantage of accommodating more channels. In other words, where there is a limit to the operating frequency of the multiplexer 54, the supply of bias currents a and a' having a phase difference of 901 k permits the number of flux sensors which can be driven by the multiplexer to be doubled without increasing its operating frequency.

In this case as well, the number of data output lines between the low-temperature environment and the room-temperature environment is one, which can reduce the consumption of the coolant.

Figure 23:
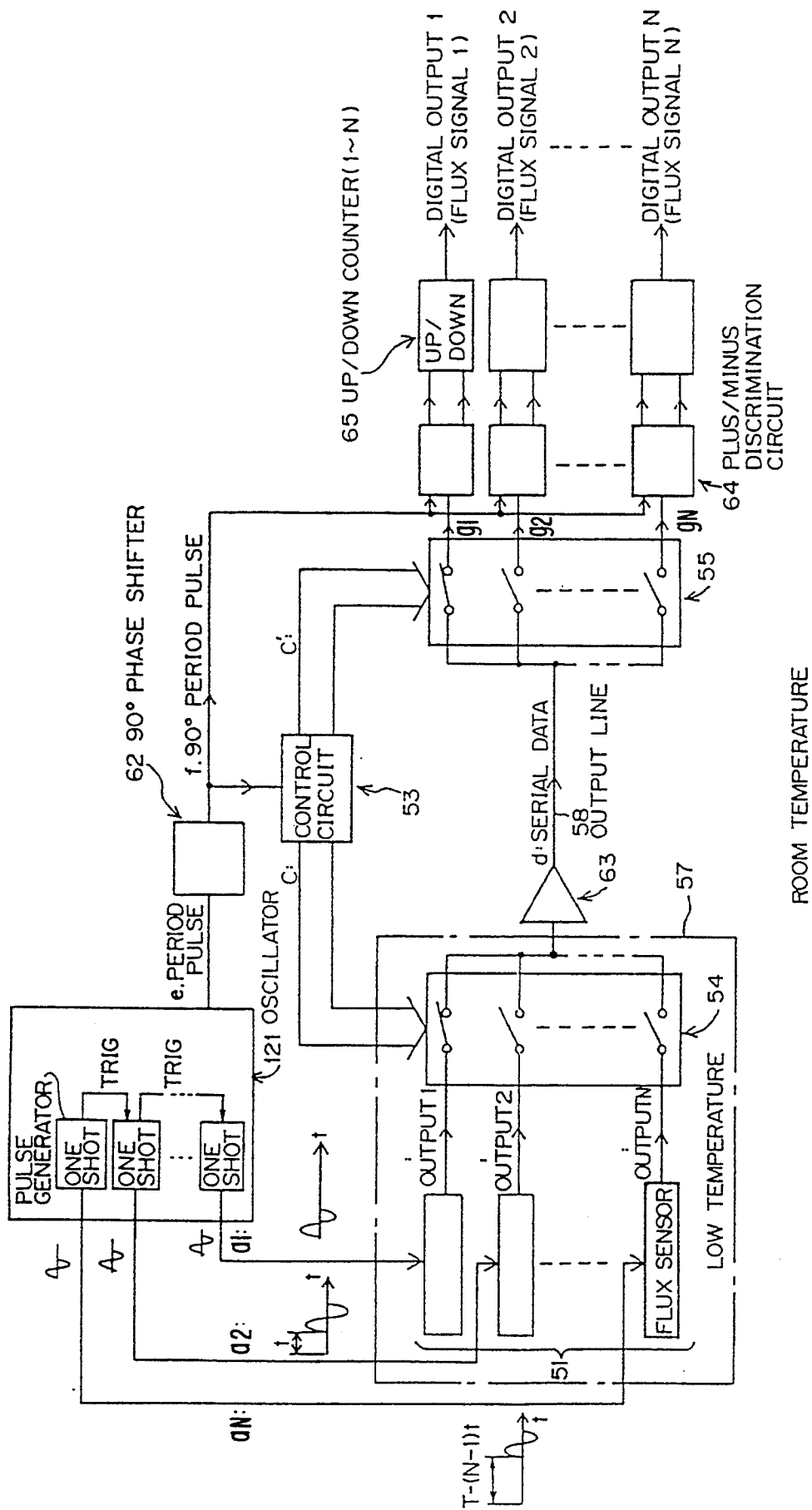
FIG. 23 illustrates an arrangement of a multichannel SQUID magnetometer according to a fifth embodiment of the present invention.
Figure 24:
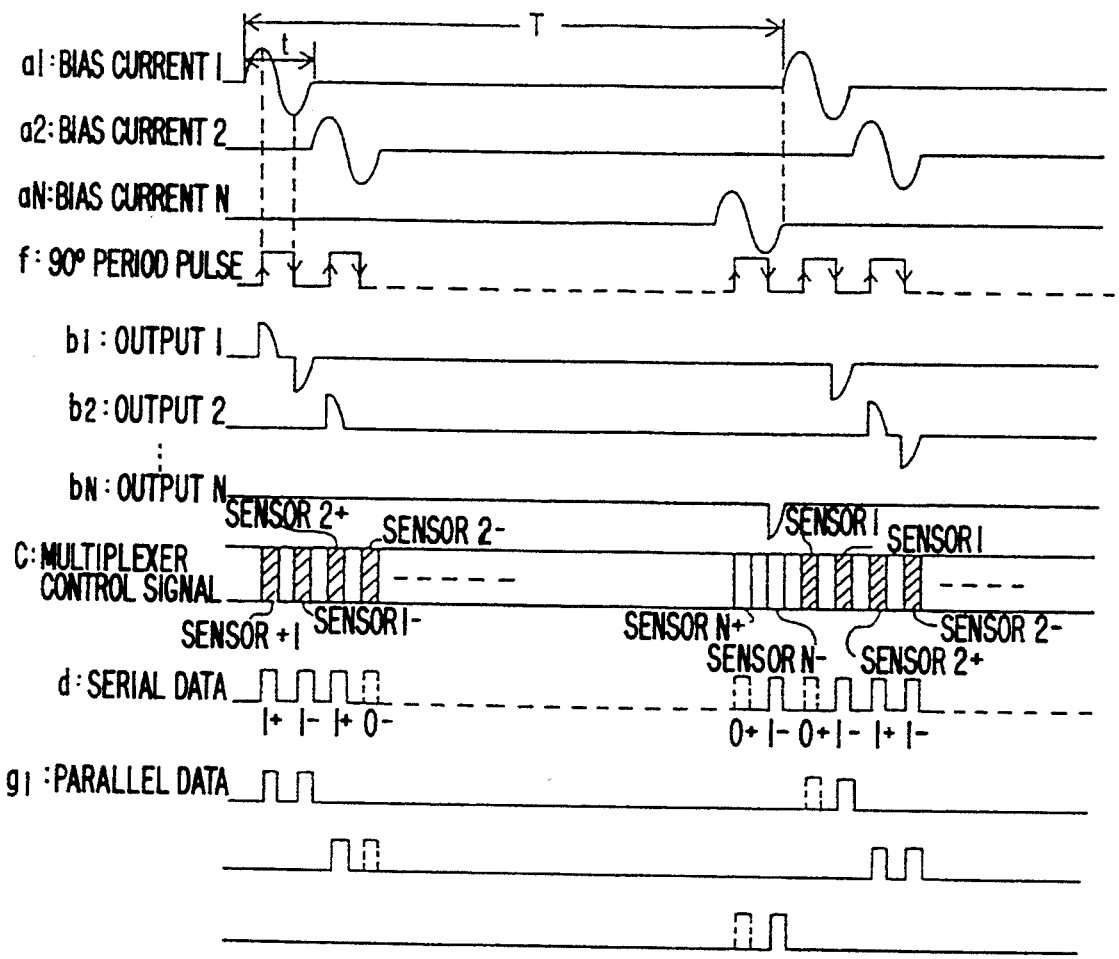
FIGS. 24 and 25 are timing diagrams which are useful in understanding the operation of the SQUID magnetometer of FIG. 23.

FIG. 23 illustrates a multichannel SQUID magnetometer according to a fifth embodiment of the present invention in which bias currents a1 to aN are supplied to the N flux sensors 51 at different times. FIG. 24 is a timing diagram for use in explanation of the operation of the fifth embodiment.

The bias currents a1 to aN are sequentially supplied, as shown in FIG. 24, from an oscillator 121 to the flux sensors in a cycle of T (which is equal to the period T in the previous embodiments). Each of the bias currents is one cycle of a sinusoidal wave with a period of t. Hence, the number of flux sensors that can be used will be given by T/t.

A positive output and a negative output are obtained in sequence from each of the flux sensors 51 during the period T. A sync pulse e (not shown) is produced synchronously with each of the bias currents a1 to aN, and a 90° sync pulse f is produced to rise and fall in synchronism with the positive and negative peaks of each of the bias currents. The multiplexer 54 selects, for example, the output b1 in synchronism with the rise of the 90° sync pulse f and then selects the output b1 again in synchronism with the fall of the sync pulse f. In this embodiment as well, delays equal to operating times of the control circuit 53 and multiplexer 54 are considered.

Figure 25:
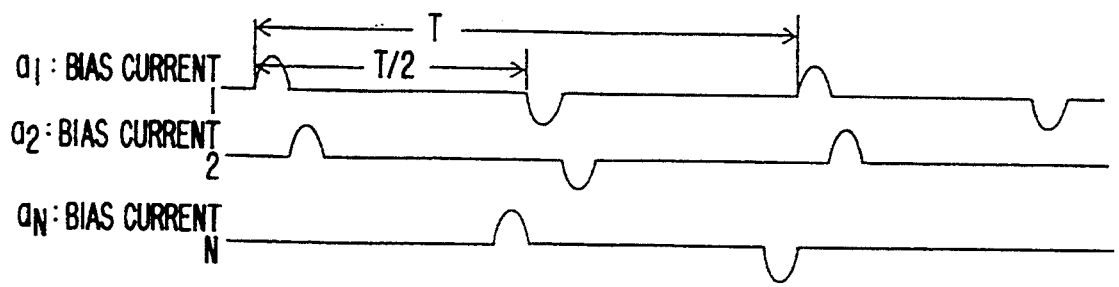

The bias currents may be such as shown in FIG. 25. That is, only a positive pulse of a duration of t/2 is applied to the flux sensor during the first half period T/2 and a negative pulse is applied during the second half period T/2. In other words, a bias current may be applied to each of the flux sensors such that a positive pulse and a negative pulse are applied with a time difference therebetween during the period T.

Figure 26:
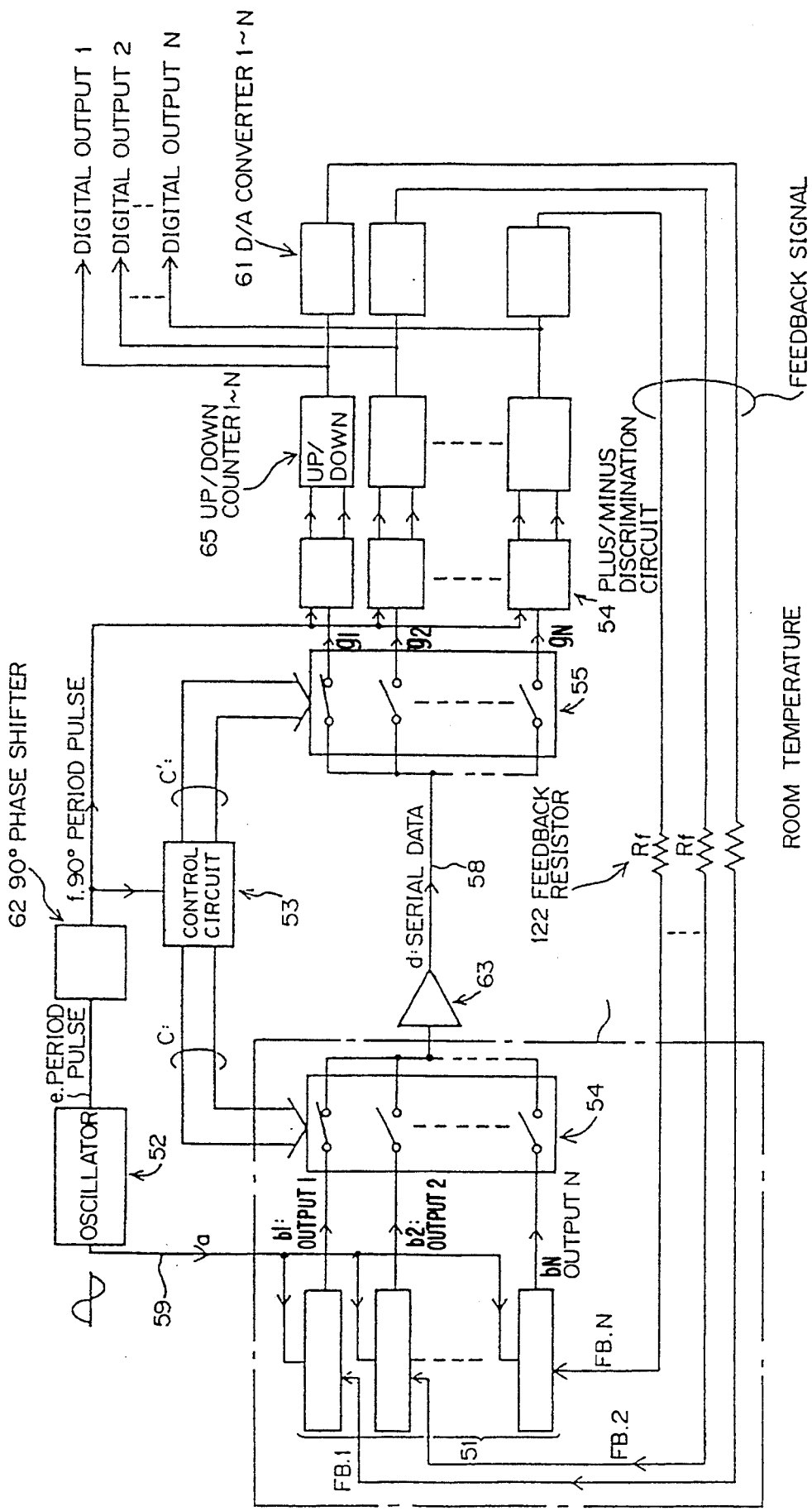
FIG. 26 illustrates an arrangement of a multichannel SQUID magnetometer according to a sixth embodiment of the present invention.

FIG. 26 illustrates a multichannel SQUID magnetometer according to a sixth embodiment of the present invention in which the feedback circuits in the above embodiments are provided on the room-temperature environment side.

In FIG. 26, the digital outputs of the up/down counters 65 are applied to respective individual D/A converters 61 and converted to analog signals. The analog signals are applied to respective individual flux sensors 51 through feedback resistors 122.

Figure 27:
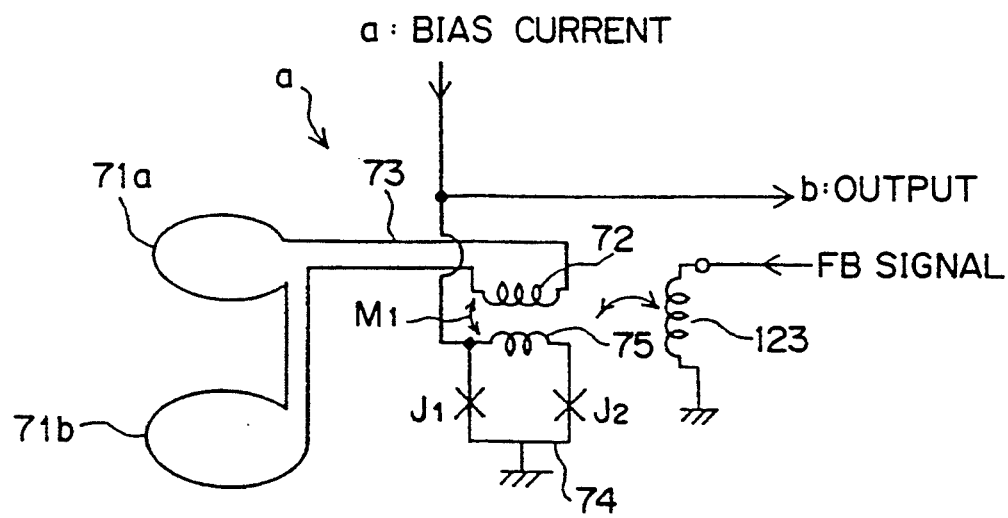
FIGS. 27 and 28 illustrate arrangements of the magnetic flux sensor used in the SQUID magnetometer of FIG. 26.
Figure 28:
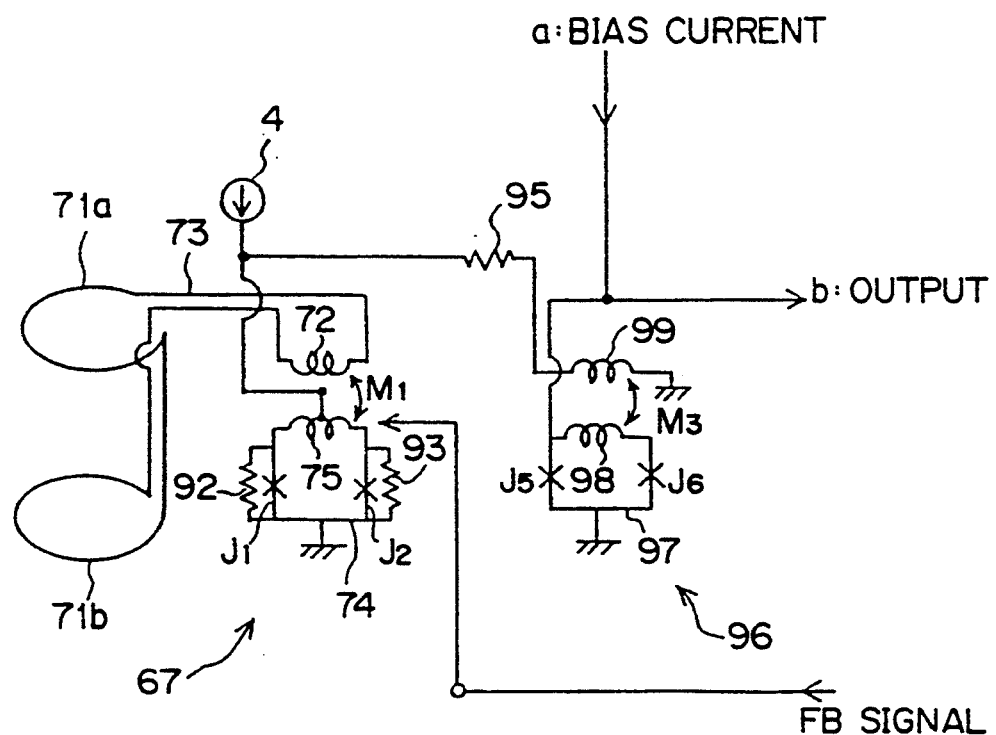

The flux sensor 51 in this embodiment has an arrangement shown in, for example, FIG. 27 or FIG. 28. The flux sensors shown in FIGS. 27 and 28 are substantially the same in arrangement as the SQUID sensors of FIGS. 12 and 13. However, as shown in FIG. 27, there is added a feedback coil 123 for inputting a feedback signal FB. The same is true of the case of FIG. 28 though it is omitted.

In this embodiment, the number of lines between the low-temperature environment and the room-temperature environment is increased by the number of feedback lines. However, since the feedback resistors 122 are provided on the room-temperature side, the amount of feedback can be varied easily. In addition, the dynamic range of the entire magnetometer can be varied easily since it is determined by those of the up/down counters 65 and D/A converters 61.

Although the preferred embodiments of the present invention have been described and disclosed, it is apparent to those skilled in the art that other embodiments and modifications are possible.

Figure 29:
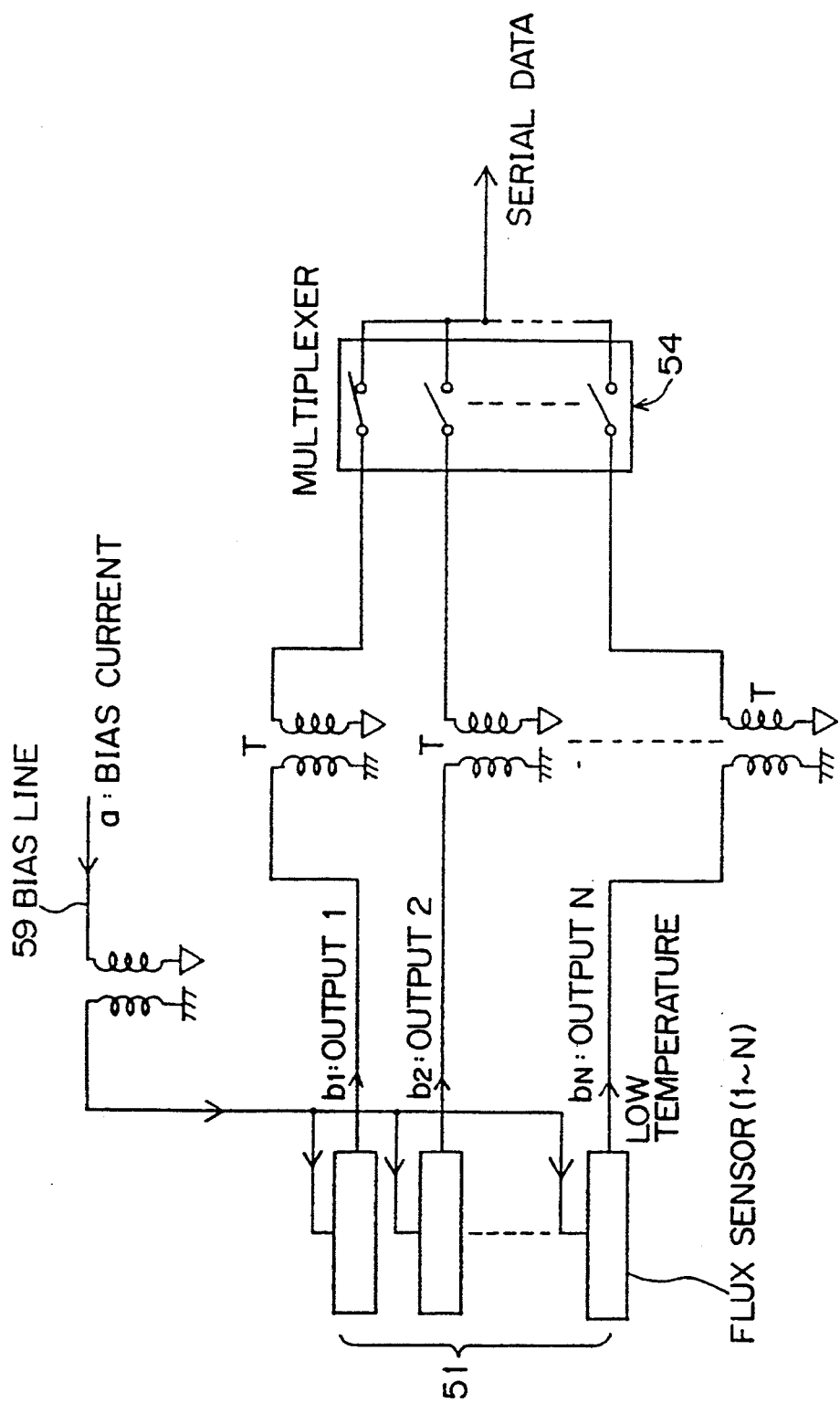
FIG. 29 is a diagram for use in explanation of isolation of ground of the magnetic flux sensors from ground of other circuits.

For example, as shown in FIG. 29, any of the embodiments may be designed such that the flux sensors 51 are isolated from other circuits with respect to ground (ground potential or ground path). This is due to the following reason. In general, an AC bias current which flows through the multiplexer 54 formed of a Josephson circuit is tens of times as large as a bias current flowing through a SQUID. This bias current corresponds to a direct current in what is referred to as a TTL but an alternating current in the Josephson circuit. Suppose now that ground of the SQUIDs is common to ground of the other circuits. In this case, it is inevitable that ground has an impedance. Thus, variations occur in its potential due to the return of a bias current. Variations in ground potential caused by the bias current of the multiplexer 54, which is much larger than the bias current of the SQUIDs as described above, will have such a great influence on the operation of the SQUIDs that they cannot be neglected. Especially when the bias current contains noise, the problem becomes serious because its current value becomes large. For this reason, ground isolation is desired.

More specifically, in FIG. 29, each of the SQUIDs 51 is magnetically coupled with the multiplexer 54 by means of a transformer T in which its primary- and secondary-winding ground terminals are isolated from each other. In the figure, different ground symbols are used to indicate ground isolation. Likewise, the flux sensors 51 are magnetically coupled with the bias line 59 by a transformer adapted for ground isolation. By doing so, bias currents of other circuits can be prevented from affecting the ground of the SQUIDs as noise. Thus, the operational reliability of the SQUIDs can be improved.

Moreover, the bias current is not necessarily required to be of a sine wave and may be of any waveform as long as it can provide positive and negative bias currents to the flux sensors and allows the flux sensors 1 to maintain their outputs during a predetermined time interval (i.e., during the sampling period of the multiplexer 4).

Furthermore, the control circuit 3 may be provided on the cooling side, in which case the number of cables extending from the cooling side can be reduced.

In addition, the above embodiments may be used in combination.

That is, in the sixth embodiment shown in FIG. 26, bias currents having a phase difference of 90° may be applied as in the embodiment shown in FIG. 21. Further, bias currents may be applied to the flux sensors 51 at intervals of time as in the embodiment shown in FIG. 23.

In the embodiments shown in FIGS. 10, 21 and 23, the feedback circuits for some of the flux sensors may be provided on the room-temperature side as in the embodiment shown in FIG. 26. Although, in this case, the consumption of a coolant increases, the amount of feedback can be varied easily.

Furthermore, tile embodiment shown in FIG. 10, 21 or 23 and the embodiment shown in FIG. 26 may be combined. For example, the N flux sensors incorporating feedback circuits in the embodiment of FIG. 10 and the N flux sensors having their feedback circuits provided on the room-temperature side in the embodiment of FIG. 26 may be used in combination. Also, a plurality of arrangements according to the embodiment of FIG. 10 may be provided in parallel. The same is true of the embodiments of FIGS. 21 and 23. In this case, in addition to the advantages of each embodiment there is provided an advantage that there is no necessity to consider the limit of the number of the flux sensors 51 which might be caused by the limit of the operating frequency of the multiplexer 54.

As described above, according to the above embodiments, since a plurality of SQUID sensors are driven at the same time by a single bias current source (or voltage source), the SQUID sensors have no response delays for input magnetic flux. Moreover, since output signals of the SQUID sensors are converted to serial data by a multiplexer and then transmitted over a single output line, the consumption of a coolant such as liquid helium can be reduced.

What is claimed is:

1. A multichannel SQUID magnetometer for measuring external magnetic fields using a plurality of SQUID flux sensors, each of said SQUID flux sensors providing SQUID flux sensor output pulses and each of said SQUID flux sensors having an independently and simultaneously operated feedback circuit, comprising:

oscillator means for simultaneously supplying periodically-variable bias currents for each of said SQUID flux sensors;

first conversion means, formed of a superconducting circuit, for time division multiplexing after a predetermined time period has passed from a start of each cycle of the bias currents output pulses output from each SQUID sensor in a feedback state; and second conversion means for demultiplexing multiplexed signals output from said first conversion means and distributing demultiplexed signals to a plurality of output terminals.

2. A multichannel SQUID magnetometer according to claim 1, wherein said plurality of SQUID flux sensors and said first conversion means are placed in a low-temperature environment, and in which said bias means and said second conversion means are placed in a room-temperature environment, wherein said oscillator means simultaneously supplies AC bias currents to each of said SQUID flux sensors, and wherein said first conversion means multiplexes an output pulse from each of said SQUID flux sensors during a second quarter of a positive half cycle of the AC bias currents and a second quarter of a negative half cycle of the AC bias currents.

3. A multichannel SQUID magnetometer according to claim 1, wherein said oscillator means simultaneously supplies AC bias currents to each of said SQUID sensors; and wherein said first conversion means multiplexes the output pulses output from each of said SQUID sensors during a second quarter of a positive half cycle and a second quarter of a negative half cycle of the AC bias currents.

4. A multichannel SQUID magnetometer according to claim 1, wherein said SQUID flux sensors belong to first and second sets of SQUID flux sensors;

wherein said oscillator means comprises means for supplying first and second bias currents with a phase difference of 90° and corresponding respectively to said first and second sets of SQUID flux sensors and for supplying sync pulses identifying the first and second sets of SQUID flux sensors; and wherein said first conversion means comprises means for multiplexing the SQUID flux sensor output pulses from each of said first and second sets of SQUID flux sensors during intervals of time when both the sync pulses identify the first and second sets and the SQUID flux sensor output pulses of said first and second sets of SQUID flux sensors have been fixed and are available.

5. A multichannel SQUID magnetometer according to claim 4, wherein said oscillator means comprises means for supplying the bias currents as first and second periodic signals having half periods;

wherein said first and second sets of SQUID flux sensors provide the SQUID flux sensor output pulses during one half of one of the half periods of the bias currents; and wherein said first conversion means comprises means for enabling multiplexing of the SQUID flux sensor output pulses during the one half of the one of the half periods of the bias currents.

6. A multichannel SQUID magnetometer according to claim 1, wherein a ground of said SQUID flux sensors, said oscillator means, said first conversion means and said second conversion means are isolated from each other.

7. A multichannel SQUID magnetometer according to claim 1, wherein said first conversion means comprises means for outputting one or more pieces of bit data at a high level prior to or during transmission of the SQUID flux sensor output pulses from said SQUID flux sensors; and wherein said second conversion means comprises means for distributing the first converted output signal to said plurality of output terminals in response to the bit data as a trigger signal.

8. A multichannel SQUID magnetometer according to claim 1, wherein said first conversion means comprises a multiplexer for multiplexing an output pulse from each of said SQUID flux sensors after a predetermined time period has passed since a start of each cycle of the bias currents and outputting a multiplexed signal to a single output line; and wherein said second conversion means comprises a demultiplexer connected to an output line.

9. A multichannel SQUID magnetometer according to claim 8, wherein said multiplexer is a superconducting multiplexer consisting of a Josephson integrated circuit.

10. A multichannel SQUID magnetometer according to claim 8, wherein each of said SQUID flux sensors comprises a feedback circuit consisting of a superconducting circuit.

11. A multichannel SQUID magnetometer according to claim 8, wherein said oscillator means comprises an oscillator for simultaneously supplying AC bias currents to each of said SQUID sensors; and wherein said first conversion means multiplexes the output pulse from each of said SQUID sensors during a second quarter of a positive half cycle and a second quarter of a negative half cycle of the AC bias currents.

12. A multichannel SQUID magnetometer according to claim 8, wherein said SQUID flux sensors comprise feedback circuits placed in a room-temperature environment.

13. A multichannel SQUID magnetometer according to claim 1, wherein said oscillator means comprises means for supplying the bias currents in parallel to all of said SQUID flux sensors at the same time.

14. A multichannel SQUID magnetometer according to claim 13, wherein said oscillator means comprises means for supplying the sync pulses and the bias currents corresponding with a 90° offset; and wherein said first conversion means comprises means for enabling multiplexing of the SQUID flux sensor output pulses during portions of time 90° offset from the bias currents.

15. A multichannel SQUID magnetometer according to claim 1, wherein said oscillator means comprises means for sequentially supplying individual bias currents to individual ones of said SQUID flux sensors; and wherein said first conversion means comprises means for multiplexing the SQUID flux sensor output pulses during intervals of time when both the sync pulses identify particular individual ones of said SQUID flux sensors and the SQUID flux sensor output pulses of the particular individual ones of said SQUID flux sensors have been fixed and are available.

* * * * *

UNITED STATES PATENT AND TRADEMARK OFFICE
CERTIFICATE OF CORRECTION

PATENT NO. : 5,355,085

DATED : October 11, 1994

INVENTOR(S) : Igarashi et al.

It is certified that error appears in the above-indentified patent and that said Letters Patent is hereby corrected as shown below:

Col. 16, line 17, after "multiplexing" insert --,--;
  line 19, after "currents" insert --,--.

Signed and Sealed this

Seventeenth Day of January, 1995

Attest:

BRUCE LEHMAN

Attesting Officer     Commissioner of Patents and Trademarks